(12) United States Patent
Lee et al.

(10) Patent No.: US 11,749,688 B2
(45) Date of Patent: Sep. 5, 2023

(54) LIGHT EMITTING DISPLAY PANEL

(71) Applicant: LG Display Co., Ltd., Seoul (KR)

(72) Inventors: Sul Lee, Paju-si (KR); JeongHyeon Choi, Paju-si (KR); Eunil Cho, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 156 days.

(21) Appl. No.: 17/132,884

(22) Filed: Dec. 23, 2020

(65) Prior Publication Data

US 2021/0193691 A1  Jun. 24, 2021

(30) Foreign Application Priority Data

Dec. 24, 2019  (KR) .................. 10-2019-0173677

(51) Int. Cl.
*H01L 27/12*   (2006.01)
*G09G 3/3275*  (2016.01)
*G09G 3/3266*  (2016.01)
*H10K 59/65*   (2023.01)
*H10K 59/131*  (2023.01)

(52) U.S. Cl.
CPC ......... *H01L 27/124* (2013.01); *G09G 3/3266* (2013.01); *G09G 3/3275* (2013.01); *H10K 59/131* (2023.02); *H10K 59/65* (2023.02)

(58) Field of Classification Search
CPC ... G09G 2300/0465; G09G 2300/0819; G09G 2300/0842; G09G 2300/0861; G09G 2310/0262; G09G 2354/00; G09G 3/3233; G09G 2300/0439; G09G 2300/0809; G09G 2300/0426; G09G 3/32; G09G 3/3225; G09G 2300/08; H01L 27/3262; H01L 27/3265; H01L 27/326; H01L 27/3244; H01L 51/52; H01L 27/3248; G06F 1/1637
See application file for complete search history.

(56) References Cited

U.S. PATENT DOCUMENTS

| | | | |
|---|---|---|---|
| 9,864,400 B2* | 1/2018 | Evans, V | H01L 27/14627 |
| 10,186,191 B2* | 1/2019 | Kang | H01L 27/3276 |
| 10,700,098 B2 | 6/2020 | Takahashi et al. | |
| 11,061,295 B2* | 7/2021 | Bang | G02F 1/1333 |
| 2017/0357113 A1* | 12/2017 | Yamazaki | G02F 1/133514 |
| 2017/0373036 A1* | 12/2017 | Yamazaki | H01L 25/048 |
| 2018/0040640 A1* | 2/2018 | Takahashi | H01L 27/1255 |

(Continued)

FOREIGN PATENT DOCUMENTS

| KR | 10-2018-0015574 A | 2/2018 |
|---|---|---|
| KR | 10-2020-0014075 A | 2/2020 |

*Primary Examiner* — Lunyi Lao
*Assistant Examiner* — Kebede T Teshome
(74) *Attorney, Agent, or Firm* — Morgan, Lewis & Bockius LLP

(57) ABSTRACT

A light emitting display panel includes a transparent area corresponding to an area where a camera is provided. The transparent area includes a first pixel circuit layer including a first pixel circuit, a second pixel circuit layer provided on the first pixel circuit layer, the second pixel circuit layer including a second pixel circuit, and a light emitting device layer provided on the second pixel circuit layer, the light emitting device layer including at least one light emitting device. A driving transistor for controlling the amount of current flowing to the light emitting device is included in at least one of the first pixel circuit layer and the second pixel circuit layer.

13 Claims, 14 Drawing Sheets

(56) References Cited

U.S. PATENT DOCUMENTS

2019/0206953 A1\* 7/2019 Hsieh ................ H01L 51/5234
2020/0043949 A1   2/2020 Lee et al.
2022/0232716 A1\* 7/2022 Lim ...................... H10K 50/80

\* cited by examiner

LIGHT EMITTING DISPLAY PANEL

CROSS-REFERENCE TO RELATED APPLICATIONS

This application claims the benefit of the Korean Patent Application No. 10-2019-0173677 filed on Dec. 24, 2019, which is hereby incorporated by reference as if fully set forth herein.

BACKGROUND

Technical Field

The present disclosure relates to a light emitting display panel.

Discussion of the Related Art

Since light emitting display apparatuses display an image by using a self-emitting device, the light emitting display apparatuses have a fast response time, low power consumption, and a good viewing angle, and thus, are attracting much attention as next-generation display apparatuses.

Each of a plurality of pixels of a light emitting display panel configuring a light emitting display apparatus includes a pixel driving circuit. The pixel driving circuit controls a level of a current flowing from a driving power source to a light emitting device on the basis of switching of a driving transistor based on a data voltage, thereby allowing the light emitting device to emit light. Therefore, the light emitting display apparatus displays a certain image.

In the light emitting display panel, a current flowing in the light emitting device of each pixel may vary based on a deviation of a threshold voltage of the driving transistor caused by a process deviation. Therefore, even when the same data voltages are supplied to pixel driving circuits of the light emitting display panel, a current output from the driving transistor may vary for each pixel, and due to this, uniform image quality may not be realized. Therefore, an internal compensation circuit for compensating for the threshold voltage of the driving transistor is included in the each of the pixel driving circuits.

Recently, a light emitting display panel applied to mobile electronic devices, virtual image display apparatuses, or head-mounted display apparatuses is progressively increasing in resolution. As a resolution of a light emitting display panel increases progressively, a size of each pixel is progressively reduced.

Therefore, it is difficult to form (or place) a pixel driving circuit, including an internal compensation circuit, in a pixel, and due to this, it is difficult to manufacture a high-resolution light emitting display panel.

SUMMARY

Accordingly, embodiments of the present disclosure are directed to a light emitting display panel that substantially obviates one or more problems due to limitations and disadvantages of the related art.

An aspect of the present disclosure is to provide a light emitting display panel in which a plurality of transistors configuring each of a plurality of pixel driving circuits are divisionally disposed at different layers.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting display panel comprises a transparent area corresponding to an area where a camera is provided. The transparent area includes a first pixel circuit layer including a first pixel circuit, a second pixel circuit layer provided on the first pixel circuit layer, the second pixel circuit layer including a second pixel circuit, and a light emitting device layer provided on the second pixel circuit layer, the light emitting device layer including at least one light emitting device. A driving transistor for controlling the amount of current flowing to the light emitting device is included in at least one of the first pixel circuit layer and the second pixel circuit layer.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION

Figure 1:
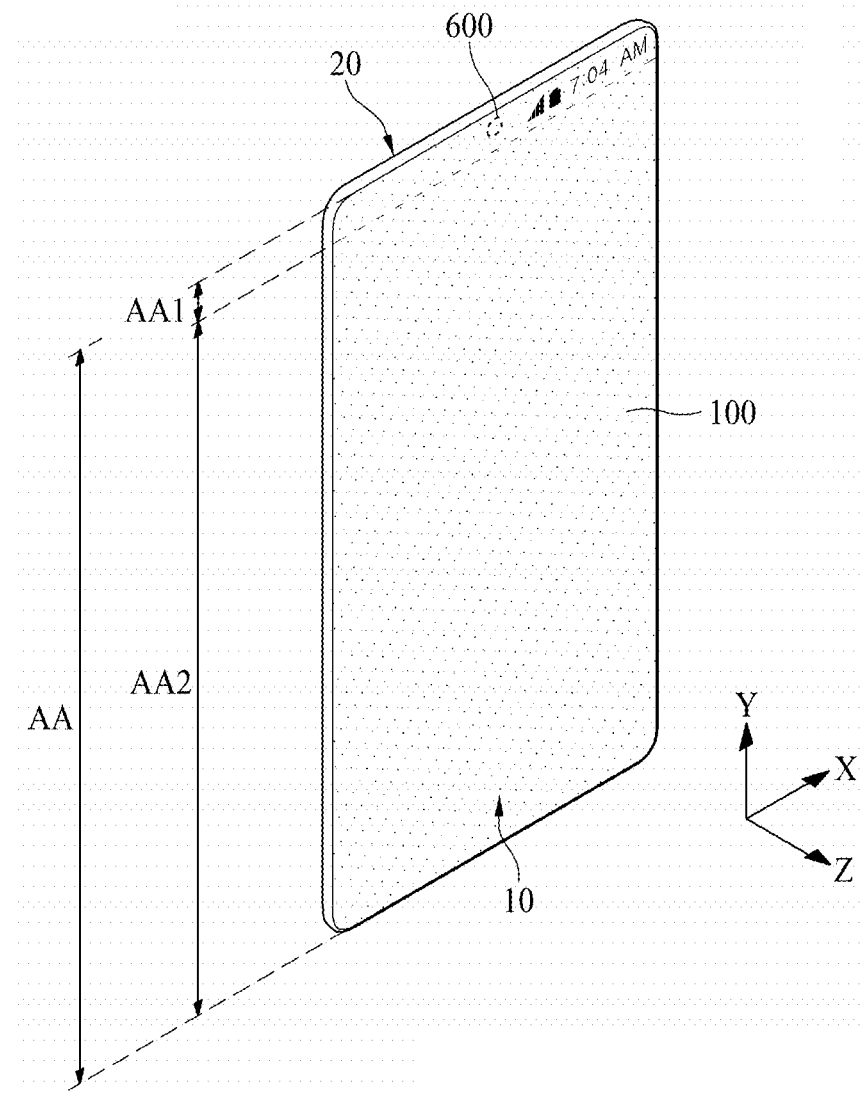
FIG. 1 is an exemplary diagram illustrating an external configuration of an electronic device to which a light emitting display panel according to an embodiment of the present disclosure is applied.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only-' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Figure 2:
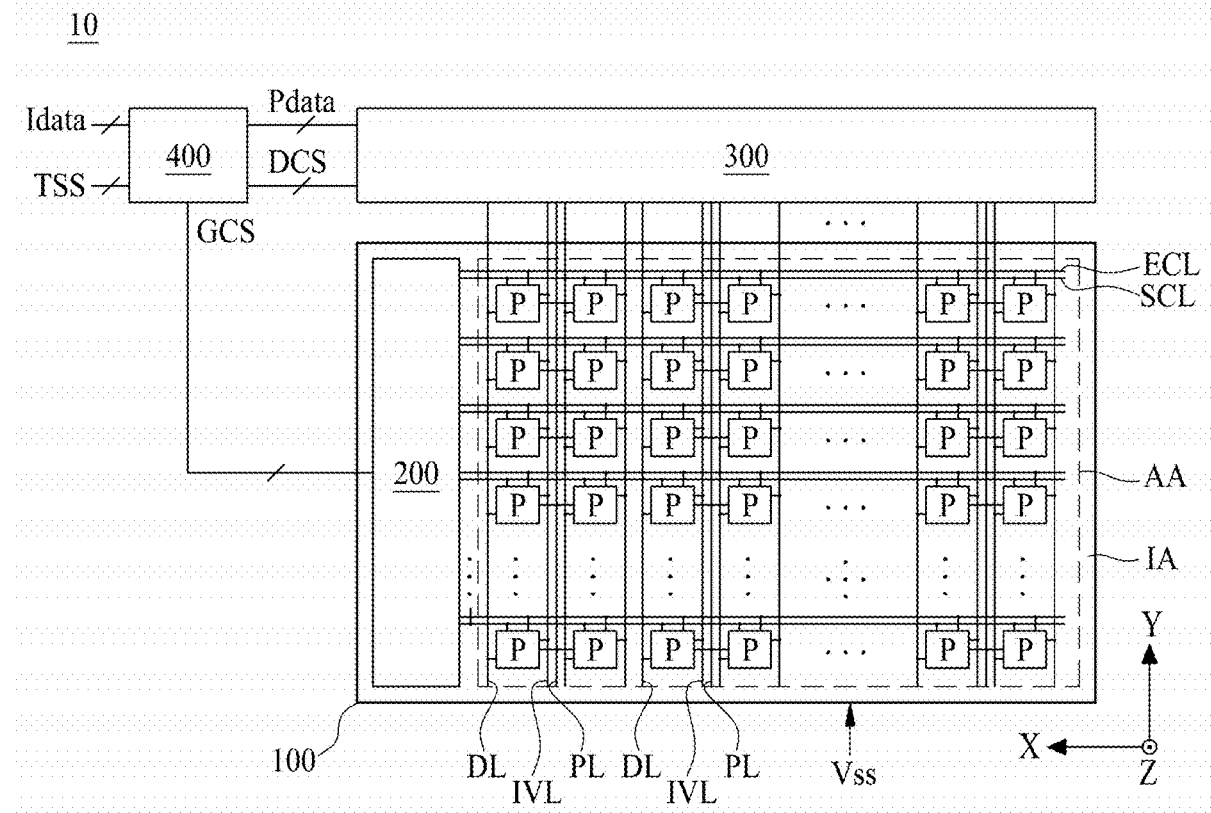
FIG. 2 is an exemplary diagram schematically illustrating a light emitting display apparatus to which a light emitting display panel according to an embodiment of the present disclosure is applied.

FIG. 1 is an exemplary diagram illustrating an external configuration of an electronic device to which a light emitting display panel according to an embodiment of the present disclosure is applied, and FIG. 2 is an exemplary diagram schematically illustrating a light emitting display apparatus to which a light emitting display panel according to an embodiment of the present disclosure is applied.

The light emitting display panel according to an embodiment of the present disclosure may configure an electronic device. The electronic device may include, for example, a smartphone, a tablet personal computer (PC), a television (TV), a monitor, etc. In FIG. 1, a smartphone is illustrated as an example of the electronic device. In the following description, an example where the electronic device is a smartphone will be described.

The electronic device, as illustrated in FIGS. 1 and 2, may include a light emitting display apparatus 10 including a light emitting display panel 100 according to the present disclosure and an external case 20 which covers the light emitting display apparatus 10.

The light emitting display apparatus 10 to which the light emitting display panel 100 according to an embodiment of the present disclosure is applied, as illustrated in FIGS. 1 and 2, may include a display area AA displaying an image and a non-display area IA provided outside the display area AA. The display area AA may include the light emitting display panel 100 including a transparent area AA1 and an opaque area AA2 provided outside the transparent area AA1, a camera 600 which is provided in the transparent area AA1 in a rea surface of the light emitting display panel 100 and photographs a region in a forward direction with respect to the light emitting display panel 100, a gate driver 200 which supplies a scan control signal to a plurality of scan control lines included in the light emitting display panel 100, a data driver 300 which supplies data voltages to a plurality of data lines included in the light emitting display panel 100, and a controller 400 which controls driving of the camera 600, the gate driver 200, and the data driver 300.

The camera 600 may be provided between the external case 20 and the light emitting display panel 100 and may be driven based on control by the controller 400 or control by an external system which controls driving of the electronic device. The camera 600 may be provided in the rear surface of the organic light emitting display panel 100 and may perform a function of photographing a region in a forward direction with respect to the light emitting display panel 100. Here, the forward direction with respect to the light emitting display panel 100 may denote a direction in which the light emitting display panel 100 displays an image.

The controller 400 may include a data aligner which realigns pieces of input video data Idata transferred from the external system by using a timing synchronization signal TSS transferred from the external system to generate pieces of pixel data Pdata and supplies the pieces of pixel data Pdata to the data driver 300, and a control signal generator which generates a gate control signal GCS and a data control signal DCS by using the timing synchronization signal TSS.

The data driver 300 may be equipped in a chip-on film attached on the light emitting display panel 100. The chip-on film may be connected to a main board including the controller 400. In this case, the chip-on film may include a plurality of lines which electrically connect the controller 400, the data driver 300, and the light emitting display panel 100, and to this end, the lines may be electrically connected to the main board and a plurality of pads included in the light emitting display panel 100.

The data driver 300 may be connected to a plurality of data lines DL provided in the light emitting display panel 100. The data driver 400 may convert pixel data Pdata, provided from the controller 400, into an analog data voltage by using the data control signal DCS and a plurality of reference gamma voltages and may provide a converted data voltage to a corresponding data line DL.

The gate driver 200 may be configured as an integrated circuit (IC), and then, may be mounted in the non-display area IA or may be directly embedded into the non-display area IA.

The gate driver 200 may generate an initialization control signal, a scan control signal, and an emission control signal respectively corresponding to an initialization period, a sampling period, and an emission period of each of a plurality of pixels P on the basis of the gate control signal GCS provided from the controller 400 and may provide the initialization control signal, the scan control signal, and the emission control signal to the plurality of pixels P.

The gate driver 200 according to an embodiment may generate emission control signals which have the same period and a sequentially-shifted phase and may supply the emission control signals to a plurality of emission control lines ECL.

The gate driver 200 according to an embodiment may be provided in a left non-display area and/or a right non-display area of a substrate through a process of manufacturing a thin film transistor (TFT) of each of the pixels P.

For example, the gate driver 200 may be provided in the left non-display area of the substrate and may supply the emission control signal to one end of each of the emission control lines ECL on the basis of a single feeding method.

As another example, the gate driver 200 may be provided in each of the left non-display area and the right non-display area of the substrate and may supply the emission control signal to both ends of each of the emission control lines ECL on the basis of a double feeding method.

The external system may perform a function of driving the controller 400 and the electronic device. That is, when the electronic device is a smartphone, the external system may receive various voice information, video information, and letter information over a wireless communication network and may transfer the video information to the controller 400. In the following description, the video information transferred from the external system to the controller 400 may be referred to as input video data. Also, the external system may execute an application for controlling the camera 600. The application may be downloaded to the external system as an application (App) type, and then, may be executed by the external system.

The light emitting display panel 100, as illustrated in FIGS. 1 and 2, may include a display area AA displaying an image and a non-display area IA provided outside (or at an outer portion) the display area AA.

The display area AA may include a transparent area AA1 where the camera 600 is disposed and an opaque area AA2 provided outside the transparent area AA1. That is, the opaque area AA2 may include all regions, except the transparent area AA1, of the display area AA.

The transparent area AA1 may be formed to be transparent so that external light is incident on the camera 600. That is, the transparent area AA1 may perform a function of allowing external light, which is incident through a front surface of the light emitting display panel 100, to travel to the camera 600 provided in a rear surface of the light emitting display panel 100.

A width of the non-display area IA may be formed to be very small, and then, when most of the non-display area IA is covered by the external case 20, as illustrated in FIG. 1, only the display area AA may be exposed at the front of the electronic device.

A shape, a size, and the like of the transparent area AA1 may be various set for each electronic device. That is, in FIG. 1, a light emitting display panel where a whole upper end portion of the light emitting display panel 100 is included in the transparent area AA1 is illustrated as an example of the present disclosure, but the transparent area AA1 may be formed at a portion of the upper end portion of the light emitting display panel 100.

Hereinafter, a structure of the light emitting display panel 100 will be described in detail.

The light emitting display panel 100 may include a substrate, the display area AA defined on the substrate, and the non-display area IA surrounding the display area AA.

The substrate may be a base substrate (or a base layer) and may include a plastic material or a glass material. The substrate according to an embodiment may have a flat tetragonal shape, a tetragonal shape where each corner portion is rounded at a certain curvature radius, or a non-tetragonal shape including at least seven sides. Here, the substrate having a non-tetragonal shape may include at least one protrusion portion or at least one notch portion.

The substrate according to an embodiment may include a colored polyimide material. For example, the substrate including a polyimide material may be formed by curing a polyimide resin which is coated to have a certain thickness on a front surface of a release layer provided in a relatively thick carrier substrate. In this case, the carrier substrate may be separated from the substrate by releasing the release layer through a laser release process. The substrate according to an embodiment may further include a back plate coupled to a rear surface of the substrate with respect to a thickness direction Z. The back plate may maintain the substrate in a flat state. The back plate according to an embodiment may include a plastic material, and for example, may include polyethylene terephthalate. The back plate may be laminated on the rear surface of the substrate separated from the carrier substrate.

According to another embodiment, the substrate may be a flexible glass substrate. For example, the substrate including a glass material may be a thin glass substrate having a thickness of 100 μm or less, or may be a carrier glass substrate which has been etched to have a thickness of 100 μm or less through a substrate etching process performed after a manufacturing process is completed.

A plurality of initialization voltage lines IVL, a plurality of scan control lines SCL, a plurality of emission control lines ECL, a plurality of data lines DL, a plurality of pixel driving voltage lines PL, a common electrode layer, and a plurality of pixels P may be provided in the display area AA.

The plurality of initialization voltage lines IVL may extend long in a second direction Y intersecting with a first direction X and may be apart from one another in the first direction X. Here, the first direction X may be a direction parallel to a widthwise direction of the substrate and the second direction Y may be a direction parallel to a lengthwise direction of the substrate. However, the present disclosure is not limited thereto, and the first direction X may be a direction parallel to the lengthwise direction of the substrate and the second direction Y may be a direction parallel to the widthwise direction of the substrate. Each of the plurality of initialization voltage lines IVL may transfer an initialization voltage, supplied from the data driver 300 or a power supply circuit, to a corresponding pixel among the plurality of pixels.

The plurality of scan control lines SCL may extend long in the first direction X and may be respectively disposed adjacent to the plurality of emission control lines ECL. Each of the plurality of scan control lines SCL may transfer a scan control signal, supplied from the gate driver 200, to a corresponding pixel among the plurality of pixels.

The plurality of emission control lines ECL may extend long in the first direction X and may be disposed in parallel with the plurality of scan control lines SCL. Each of the plurality of emission control lines ECL may transfer an emission control signal, supplied from the gate driver 200, to a corresponding pixel among the plurality of pixels.

The plurality of data lines DL may extend long in the second direction Y and may be apart from one another in the first direction X. Each of the plurality of data lines DL may transfer a data voltage, supplied from the data driver 300, to a corresponding pixel among the plurality of pixels.

The plurality of pixel driving voltage lines PL may be respectively disposed in parallel with the plurality of data lines DL. Each of the plurality of pixel driving voltage lines PL may transfer a pixel driving voltage, supplied from the data driver 300 or the power supply circuit, to a corresponding pixel among the plurality of pixels.

Each of the plurality of pixel driving voltage lines PL according to an embodiment may be disposed to correspond to two pixels each disposed adjacent to each other in the first direction X. That is, one pixel driving voltage line PL may be disposed to be shared by two pixels disposed adjacent to each other in the first direction X.

The common electrode layer may be disposed the whole display area AA. The common electrode layer may transfer a common voltage Vss, supplied from the data driver 300 or the power supply circuit, to the plurality of pixels. At least one common power supply line electrically connected to the common electrode layer may be provided in the display area AA.

A generic name for lines provided in parallel in one direction (for example, the second direction Y) among the lines may be signal lines. The signal lines may include the initialization voltage lines IVL, the data lines DL, and the pixel driving voltage lines PL. The scan control lines SCL and the emission control lines ECL may be connected to the gate driver 200, and thus, may be arranged in parallel with the first direction X. However, the signal lines may denote the scan control lines SCL and the emission control lines ECL, which are provided in parallel in the first direction X.

Each of the plurality of pixels P may be disposed in a pixel area defined in the display area AA and may be electrically connected to a corresponding initialization voltage line IVL, a corresponding scan control line SCL, a corresponding emission control line ECL, a corresponding data line DL, a pixel driving voltage line PL, and the common electrode layer, which pass through the pixel area or are disposed near the pixel area.

In this case, in order to implement the light emitting display panel 100 having a high resolution, each of the scan control line SCL and the emission control line ECL may be disposed to pass through or by the pixel area, and each of the initialization voltage line IVL, the data line DL, and the pixel driving voltage line PL may be disposed at an outer portion of the pixel area. Also, two pixels disposed adjacent to each other in the first direction X may have a symmetrical structure with respect to the pixel driving voltage line PL.

The pixels P according to an embodiment may be disposed to a stripe structure in the display area AA. In this case, one unit pixel may include red pixel, a green pixel, and a blue pixel, and moreover, may further include white pixel.

According to another embodiment, the pixels P may be disposed to have a pentile structure in the display area AA. In this case, one unit pixel may include at least one red pixel, at least two green pixels, and at least one blue pixel, which are arranged to one-dimensionally have a polygonal shape. For example, one unit pixel having the pentile structure may be disposed so that one red pixel, two green pixels, and one blue pixel are arranged to one-dimensionally have an octagonal shape, and in this case, the blue pixel may include an opening area (or an emission area) having a relatively largest size and the green pixel may include an opening area having a relatively smallest size.

Each of the plurality of pixels P may operate in the order of the initialization period, the sampling period, and the emission period to emit light having luminance corresponding to a data voltage supplied through a corresponding data line DL.

The non-display area IA may be provided along an edge of the substrate to surround the display area AA. One non-display region of the non-display area IA may include a pad part.

The pad part may be disposed in one non-display area of the substrate and may be electrically connected to lines disposed in the display area AA in the second direction Y. Also, the pad part may be electrically connected to the data driver 300.

Figure 3:
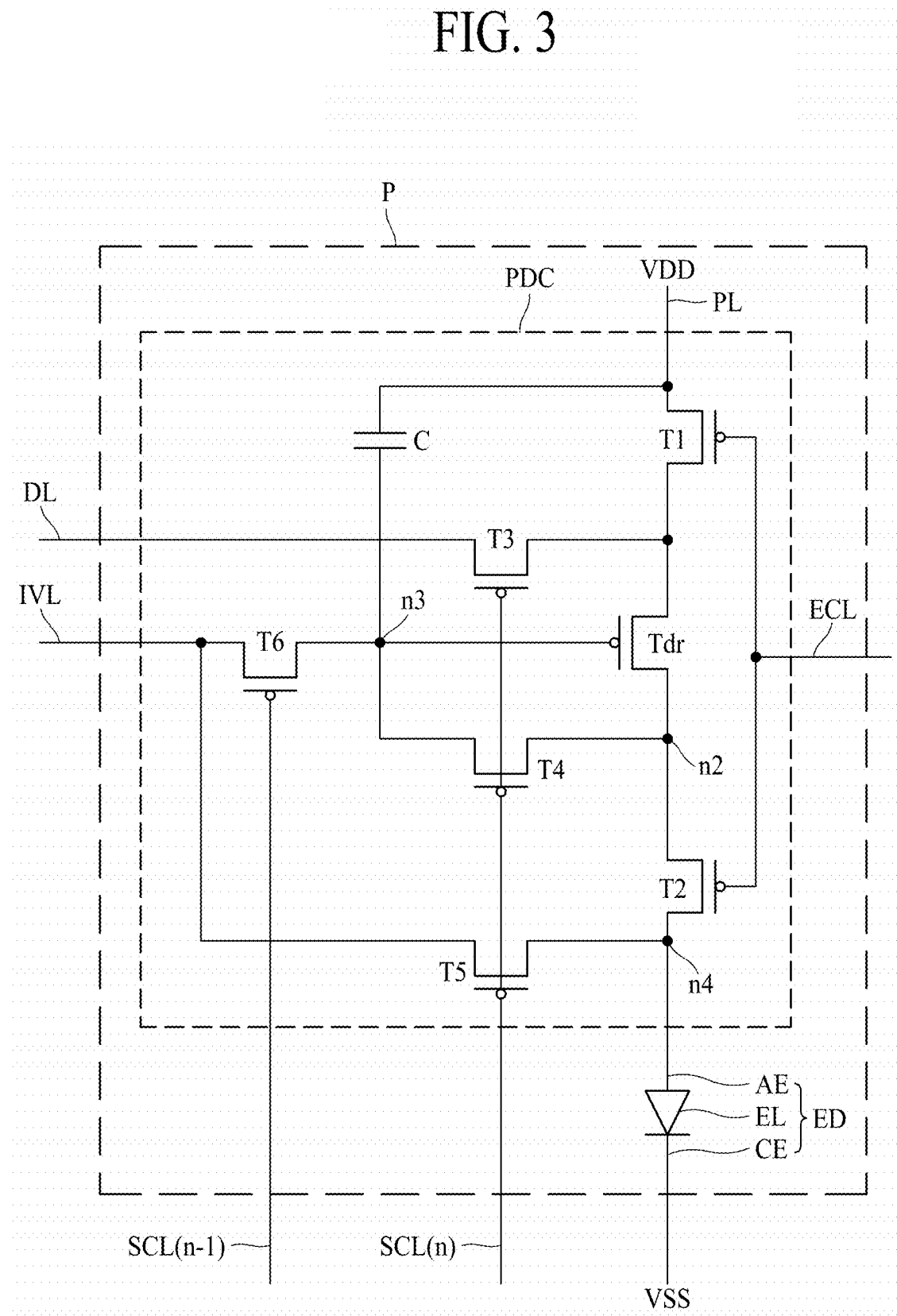
FIG. 3 is a circuit diagram of an embodiment of a pixel applied to a light emitting display panel according to the present disclosure.

FIG. 3 is a circuit diagram of an embodiment of a pixel applied to a light emitting display panel according to the present disclosure.

Each of a plurality of pixels P applied to the light emitting display panel according to the present disclosure, as illustrated in FIG. 3, may include a pixel driving circuit PDC and a light emitting device ED connected to the pixel driving circuit PDC.

The pixel driving circuit PDC, as illustrated in FIG. 3, may include a first transistor T1 which includes a first terminal connected to a pixel driving voltage line PL, a second terminal connected to a first terminal of a driving transistor Tdr, and a gate connected to an emission control line ECL, the driving transistor Tdr which includes a first terminal connected to the second terminal of the first transistor T1, a second terminal connected to a first terminal of a second transistor T2, and a gate connected to a second terminal of a capacitor C, the second transistor T2 which includes a gate connected to the emission control line ECL, the first terminal connected to the second terminal of the driving transistor Tdr, and a second terminal connected to the light emitting device ED, the capacitor C which includes a first terminal connected to the first terminal of the first terminal T1 and the second terminal connected to the gate of the driving transistor Tdr, a third transistor T3 which includes a gate connected to an $n^{th}$ scan control line SCL(n), a first terminal connected to a data line DL, and a second terminal connected to the first terminal of the driving transistor Tdr, a fourth transistor T4 which includes a gate connected to the $n^{th}$ scan control line SCL(n), a first terminal connected to the gate of the driving transistor Tdr, and a second terminal connected to the second terminal of the driving transistor Tdr, a fifth transistor T5 which includes a gate connected to the $n^{th}$ scan control line SCL(n), a first terminal connected to an initialization voltage line IVL, and a second terminal connected to the second terminal of the second transistor T2, and a sixth transistor T6 which includes a gate connected to an $n-1^{th}$ scan control line SCL(n-1), a first terminal connected to the initialization voltage line IVL, and a second terminal connected to the first terminal of the fourth transistor T4.

The pixel driving circuit PDC may be applied a plurality of pixels P provided in the transparent area AA1 and may also be applied to a plurality of pixels P provided in the opaque area AA2.

However, an arrangement structure of the pixel driving circuit PDC included in each of the pixels provided in the transparent area AA1 may differ from an arrangement structure of the pixel driving circuit PDC included in each of the pixels provided in the opaque area AA2. That is, in order to increase a light transmittance of the transparent area AA1, an arrangement structure of the pixel driving circuit PDC in the transparent area AA1 may be formed to be different from an arrangement structure of the pixel driving circuit PDC in the opaque area AA2.

A structure of the pixel driving circuit PDC in the opaque area AA2 may be similar to a structure of the pixel driving circuit PDC in the opaque area AA2, which is used currently and generally, and thus, its detailed description is omitted.

Hereinafter, therefore, a structure of the pixel driving circuit PDC included in each pixel provided in the transparent area AA1 will be described in detail.

In the following description, when the pixel driving circuit needs to be divided by pixel units, the pixel driving circuit may be referred to as a first pixel driving circuit or a second pixel driving circuit.

Figure 4:
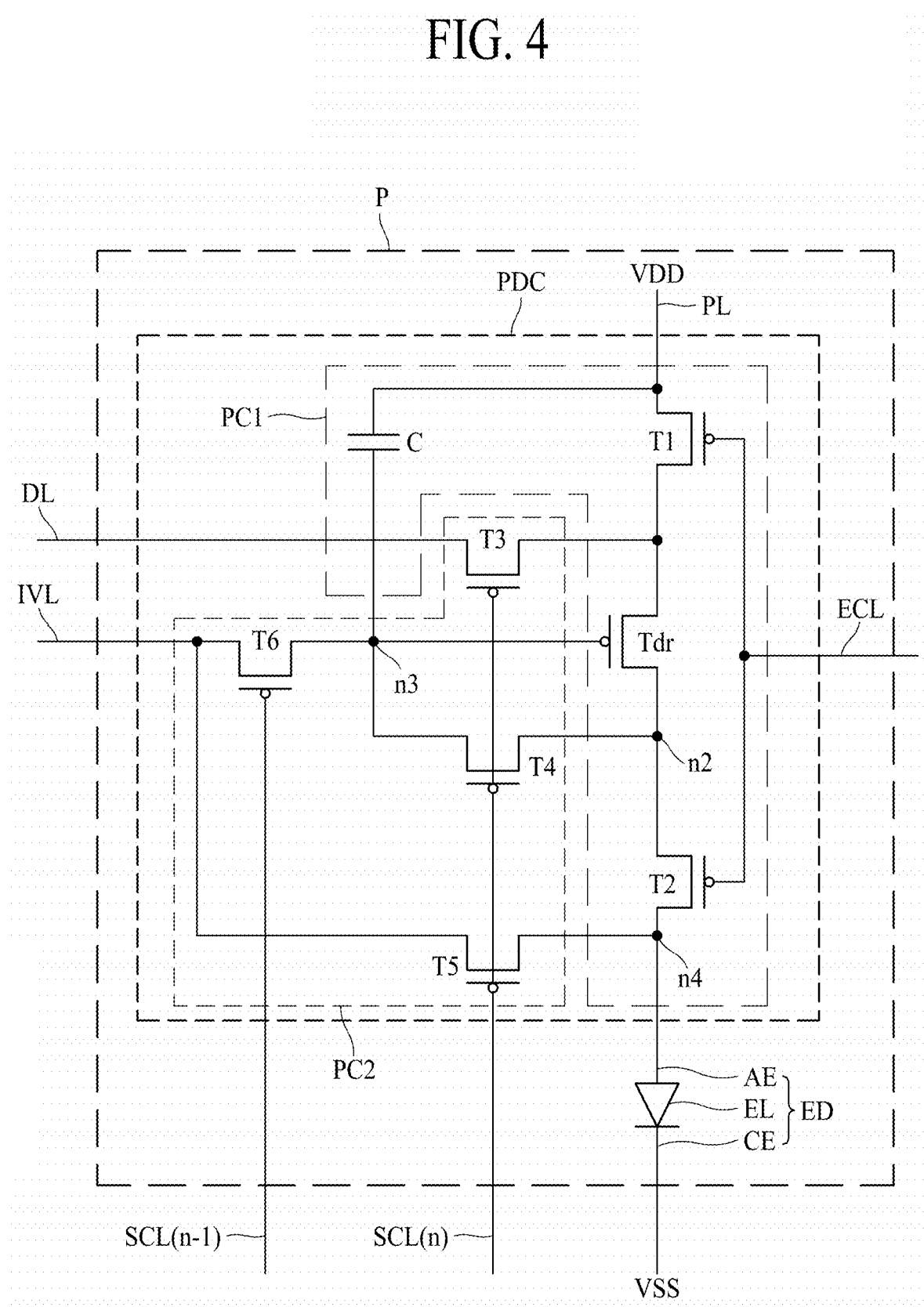
FIG. 4 is a circuit diagram illustrating an example where a pixel driving circuit illustrated in FIG. 3 is divided by layer units.
Figure 5:
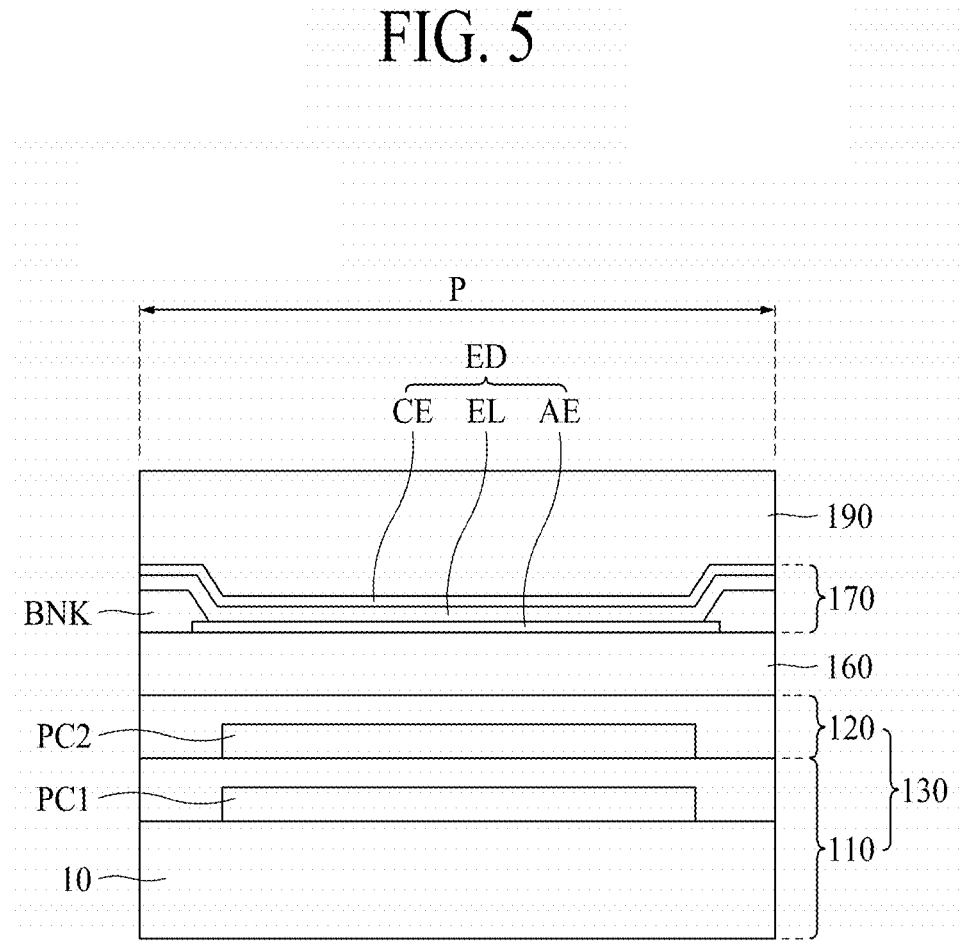
FIG. 5 is a cross-sectional view illustrating a layer structure of a pixel illustrated in FIG. 4.
Figure 6:
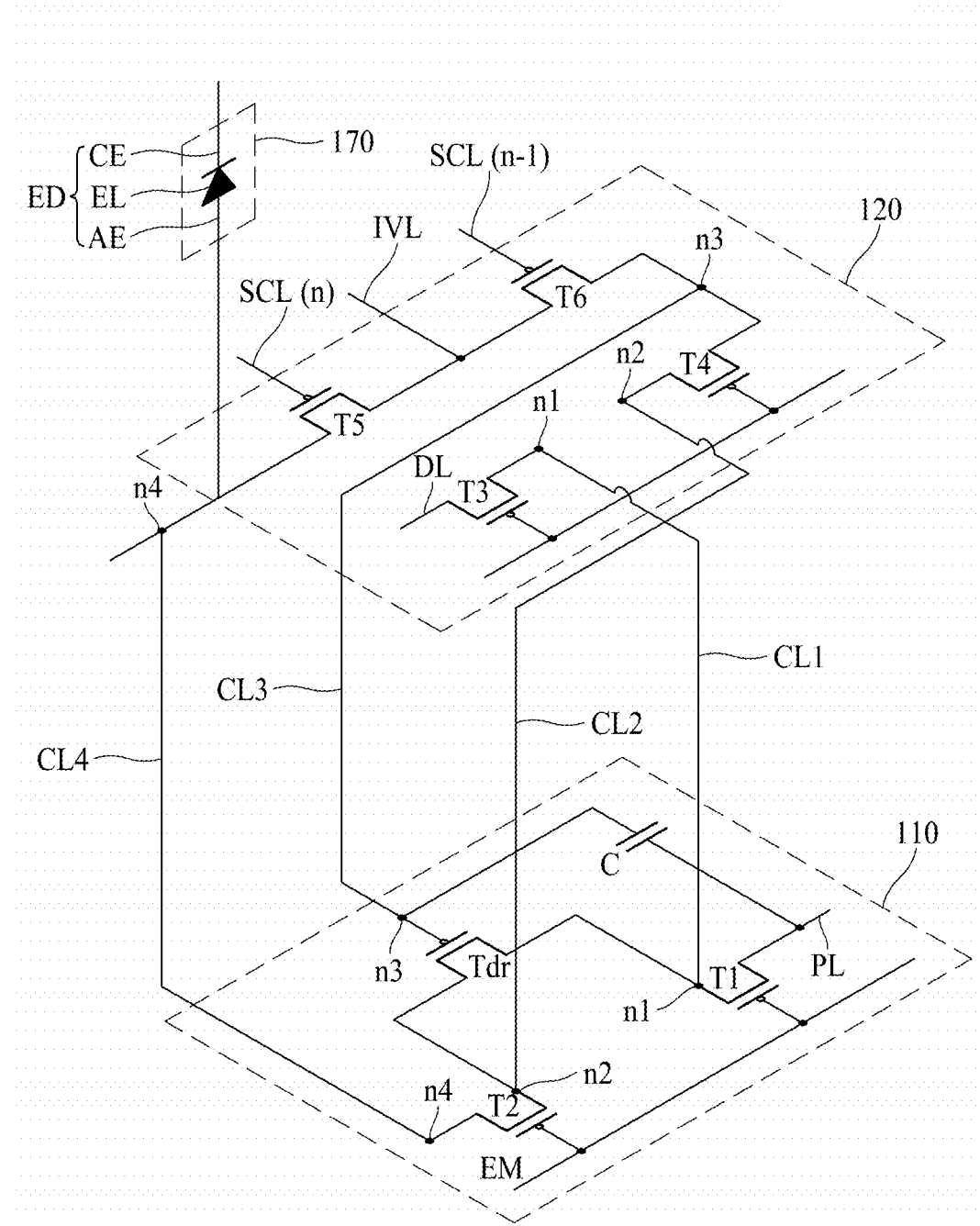
FIG. 6 is a diagram illustrating a circuit configuration of each layer illustrated in FIG. 4.

FIG. 4 is a circuit diagram illustrating an example where a pixel driving circuit illustrated in FIG. 3 is divided by layer units, FIG. 5 is a cross-sectional view illustrating a layer structure of a pixel illustrated in FIG. 4, and FIG. 6 is a diagram illustrating a circuit configuration of each layer illustrated in FIG. 4.

As described above, the light emitting display panel according to the present disclosure may include a display area AA displaying an image and a non-display area IA provided outside the display area AA. The display area AA may include a transparent area AA1 where a camera 600 is disposed and an opaque area AA2 provided outside the transparent area AA1.

In this case, the transparent area AA1 may include a first pixel circuit layer 110 including a first pixel circuit PC1, a second pixel circuit layer 120 which is provided on the first pixel circuit layer 110 and includes a second pixel circuit PC2, and a light emitting device layer 170 which is provided on the second pixel circuit layer 120 and includes at least one light emitting device ED. A driving transistor for controlling the amount of current flowing to the at least one light emitting device ED may be included in at least one of the first pixel circuit layer 110 and the second pixel circuit layer 120.

That is, as illustrated in FIGS. 4 to 6, a pixel P applied to the light emitting display panel according to the present disclosure may include a pixel driving circuit layer 130 including the pixel driving circuit PDC and a light emitting device layer 170 including a light emitting device ED electrically connected to the pixel driving circuit PDC.

The pixel driving circuit layer 130 may include a first pixel circuit layer 110 including a first pixel circuit PC1 and a second pixel circuit layer 120 including a second pixel circuit PC2.

The first pixel circuit PC1 and the second pixel circuit PC2 may be included in a pixel driving circuit (hereinafter referred to as a first pixel driving circuit) configuring one pixel (hereinafter simply referred to as a first pixel among a plurality of pixels provided in the transparent area AA1, and a light emitting device (hereinafter simply referred to as a first light emitting device) connected to the second pixel circuit PC2 may be included in the light emitting device layer 170.

That is, in the present disclosure, the first pixel circuit PC1 and the second pixel circuit PC2 may configure the first pixel driving circuit included in the first pixel.

To provide an additional description, in the present disclosure, the first pixel circuit PC1 and the second pixel circuit PC2 each configuring one pixel driving circuit PDC may be provided at different layers, and the first light emitting device ED connected to the second pixel circuit PC2 may be provided on the second pixel circuit PC2.

First, the first pixel circuit layer 110 according to an embodiment may include a substrate 110, a first pixel circuit PC1, a pixel driving voltage line PL for transferring the pixel driving voltage to the first pixel circuit PC1, and an emission control line ECL for transferring an emission control signal to the first pixel circuit PC1.

The substrate 10, as described above, may include a plastic material or a glass material.

The emission control line ECL may be disposed in a pixel P in parallel with a first direction X.

The pixel driving voltage line PL may be disposed in the pixel P in parallel with a second direction Y.

The first pixel circuit PC1 may control the amount of current flowing to the light emitting device ED.

The first pixel circuit PC1 according to an embodiment may include a first transistor T1 which includes a first terminal connected to a pixel driving voltage line PL, a gate connected to an emission control line ECL, and a second terminal connected to the second pixel circuit PC2 through a first connection line CL1, a driving transistor Tdr which includes a first terminal connected to the second terminal of the first transistor T1, a second terminal connected to the second pixel circuit PC2 through a second connection line CL2, and a gate connected to the second pixel circuit PC2 through a third connection line CL3, a second transistor T2 which includes a gate connected to the emission control line ECL, a first terminal connected to the second terminal of the driving transistor Tdr, and a second terminal connected to the light emitting device ED through a fourth connection line CL4, and a capacitor C which includes a first terminal connected to the first terminal of the first terminal T1 and a second terminal connected to the gate of the driving transistor Tdr.

The driving transistor Tdr may transfer, to the light emitting device ED, a current corresponding to a gate-source voltage based on a data voltage supplied through the data line DL.

The driving transistor Tdr according to an embodiment may include the first terminal connected to the second terminal of the third transistor T3 through the first connection line CL1 connected to a first node n1, the second terminal connected to the fourth transistor T4 included in the second pixel circuit layer 120 and the second transistor T2, and the gate connected to the sixth transistor T6 included in the second pixel circuit layer 120 and the capacitor C.

The first terminal of the driving transistor Tdr may be a source electrode, and the second terminal thereof may be a drain electrode. The driving transistor Tdr may be turned on based on a gate-source voltage thereof, and thus, a current corresponding to the gate-source voltage based on the data voltage may flow in the first transistor T1, the driving transistor Tdr, the second transistor T2, and the light emitting device ED.

The first terminal of the driving transistor Tdr may be connected to the first transistor T1 and the third transistor T3 through the first node n1. Particularly, the first terminal of the driving transistor Tdr may be connected to the second terminal of the third transistor T3 included in the second pixel circuit layer 120 through the first connection line CL1 at the first node n1.

The second terminal of the driving transistor Tdr may be connected to the fourth transistor T4 and the second transistor T2 through the second node n2. Particularly, the second terminal of the driving transistor Tdr may be connected to the second terminal of the fourth transistor T4 included in the second pixel circuit layer 120 through the second connection line CL2 at the second node n2.

The first transistor T1 may be turned on or off based on the emission control signal supplied through the emission control line ECL. When the first transistor T1 is turned on, a current may be supplied to the driving transistor Tdr.

The first transistor T1 according to an embodiment may include the gate connected to the emission control line ECL, the first terminal connected to the pixel driving voltage line PL, and the second terminal connected to the first terminal of the driving transistor Tdr. The second terminal of the first transistor T1 may be connected to, through the first connection line CL1, the second terminal of the third transistor T3 included in the second pixel circuit layer 120.

The second transistor T2 may be turned on or off based on the emission control signal supplied through the emission control line ECL. When the second transistor T2 is turned on, a current may be supplied to the light emitting device ED through the first transistor T1, the driving transistor Tdr, and the second transistor T2.

The second transistor T2 according to an embodiment may include the gate connected to the emission control line ECL, the first terminal connected to the second terminal of the driving transistor Tdr, and the second terminal connected to the light emitting device ED.

The second terminal of the second transistor T2 may be connected to the second terminal of the fifth transistor T5. Particularly, the second terminal of the second transistor T2 may also be connected to, through the fourth connection line CL4, the second terminal of the fifth transistor T5 included in the second pixel circuit layer 120 at a fourth node n4.

In the following description, in a case where the gates of the first to sixth transistors T1 to T6 should be distinguished from one another, the gates may be referred to as first to sixth gate electrodes. Also, the gate of the driving transistor Tdr may be referred to as a driving gate electrode. However, in a case where it is not needed to distinguish the gates, each of the gates of the first to sixth transistors T1 to T6 may be simply referred to as a gate.

Each of the first transistor T1, the second transistor T2, and the driving transistor Tdr may include a semiconductor layer including an amorphous silicon material, a polysilicon material, or an oxide semiconductor material and may be a P-type TFT including a semiconductor layer doped with P-type impurities, but is not limited thereto and may use may be an N-type TFT including a semiconductor layer doped with N-type impurities. That is, in FIG. 4, a pixel driving circuit PDC including a plurality of P-type TFTs is illustrated, but the pixel driving circuit PDC may include a plurality of N-type TFTs.

The polysilicon material may be good in reliability with respect to a strong bias stress and may have high electron mobility. Therefore, each of the first transistor T1, the second transistor T2, and the driving transistor Tdr according to an embodiment may include a P-type TFT including a semiconductor layer including a polysilicon material doped with P-type impurities.

Features of materials included in the first transistor T1, the second transistor T2, and the driving transistor Tdr may be applied to all of the third to sixth transistors T3 to T6.

The capacitor C may store a data voltage supplied through the data line DL. Also, the capacitor C may store an initialization voltage supplied through the initialization voltage line IVL. Also, the capacitor C may store a threshold voltage of the driving transistor Tdr. That is, the capacitor C may sense a variation of the threshold voltage of the driving transistor Tdr and may store the threshold voltage, for performing an internal compensation function of compensating for the variation of the threshold voltage.

The first terminal of the capacitor C according to an embodiment may be connected to the first terminal of the first transistor T1 and the pixel driving voltage line PL.

The second terminal of the capacitor C may be connected to a third node n3. That is, the second terminal of the capacitor C may be connected to the gate of the driving transistor Tdr, the first terminal of the fourth transistor T4, and the second terminal of the sixth transistor T6. Particularly, the second terminal of the capacitor C may be connected to, through the third connection line CL3, the first terminal of the fourth transistor T4 included in the second pixel circuit layer 120 and the second terminal of the sixth transistor T6 included in the second pixel circuit layer 120 at the third node n3.

Second, the second pixel circuit layer 120 may be disposed at a top surface (or a surface) of the first pixel circuit layer 120. The second pixel circuit layer 120 according to an embodiment may include a second pixel circuit PC2, an $n^{th}$ scan control line SCL(n) for transferring an $n^{th}$ scan control signal to the second pixel circuit PC2, an $n-1^{th}$ scan control line SCL(n−1) for transferring an $n-1^{th}$ scan control signal to the second pixel circuit PC2, a data line DL for transferring a data voltage to the second pixel circuit PC2, and an initialization voltage line IVL for transferring an initialization voltage to the second pixel circuit PC2.

The $n^{th}$ scan control line SCL(n) may be disposed in the pixel P so as to be apart from and in parallel with the emission control line ECL.

The n−1$^{th}$ scan control line SCL(n−1) may be disposed in the pixel P so as to be apart from and in parallel with the n$^{th}$ scan control line SCL(n).

The data line DL may be disposed at one edge of the pixel P in parallel with the second direction Y.

The initialization voltage line IVL may be disposed in the pixel P in parallel with the data line DL. The initialization voltage supplied through the initialization voltage line IVL may initialize the capacitor C, the gate of the driving transistor Tdr, and the light emitting device ED.

The second pixel circuit PC2 may charge the data voltage, supplied through the data line DL, into the capacitor C and may drive the driving transistor Tdr.

The second pixel circuit PC2 according to an embodiment may include a third transistor T3 which includes a gate connected to the n$^{th}$ scan control line SCL(n), a first terminal connected to the data line DL, and a second terminal connected to the first terminal of the driving transistor Tdr through the first connection line CL1, a fourth transistor T4 which includes a gate connected to the n$^{th}$ scan control line SCL(n), a first terminal connected to the gate of the driving transistor Tdr through the third connection line CL3, and a second terminal connected to the second terminal of the driving transistor Tdr through the second connection line CL2, a fifth transistor T5 which includes a gate connected to the n$^{th}$ scan control line SCL(n), a first terminal connected to the initialization voltage line IVL, and a second terminal connected to the second terminal of the second transistor T2 through the fourth connection line CL4, and a sixth transistor T6 which includes a gate connected to the n−1$^{th}$ scan control line SCL(n−1), a first terminal connected to the initialization voltage line IVL, and a second terminal connected to the first terminal of the fourth transistor T4.

The third transistor T3 may be turned on or off based on the n$^{th}$ scan control signal supplied through the n$^{th}$ scan control line SCL(n). When the third transistor T3 is turned on, the data voltage supplied through the data line DL may be charged into the capacitor C.

The third transistor T3 according to an embodiment may include the gate connected to the n$^{th}$ scan control line SCL(n), the second terminal connected to the first terminal of the driving transistor Tdr through the first node n1, and the first terminal connected to the data line DL. Particularly, the second terminal of the third transistor T3 may be connected to, through the first connection line CL1, the second terminal of the first transistor T1 included in the first pixel circuit layer 110 and the first terminal of the driving transistor Tdr included in the first pixel circuit layer 110 at the first node n1.

The fourth transistor T4 may be turned on or off based on the n$^{th}$ scan control signal supplied through the n$^{th}$ scan control line SCL(n). When the fourth transistor T4 is turned on, the data voltage supplied through the data line DL, the third transistor T3, and the driving transistor Tdr may be charged into the capacitor C.

The fourth transistor T4 according to an embodiment may include the gate connected to the n$^{th}$ scan control line SCL(n), the first terminal connected to the gate of the driving transistor Tdr, and the second terminal connected to the second terminal of the driving transistor Tdr.

The first terminal of the fourth transistor T4 may be connected to the second terminal of the sixth transistor T6 and the second terminal of the capacitor C. Also, the second terminal of the fourth transistor T4 may be connected to the first terminal of the second transistor T2. Particularly, the first terminal of the fourth transistor T4 may be connected to the gate of the driving transistor Tdr included in the first pixel circuit layer 110 at the third node n3, and moreover, may be connected to the second terminal of the capacitor C included in the first pixel circuit layer 110.

The fifth transistor T5 may be turned on or off based on the n$^{th}$ scan control signal supplied through the n$^{th}$ scan control line SCL(n). When the fifth transistor T5 is turned on, the light emitting device ED may be initialized by the initialization voltage supplied through the initialization voltage line IVL and the fifth transistor T5.

The fifth transistor T5 according to an embodiment may include the gate connected to the n$^{th}$ scan control line SCL(n), the first terminal connected to the initialization voltage line IVL, and the second terminal connected to the light emitting device ED. The first terminal of the fifth transistor T5 may be connected to the first terminal of the sixth transistor T6. The second terminal of the fifth transistor T5 may be connected to the second terminal of the second transistor T2 and the light emitting device ED. Particularly, the second terminal of the fifth transistor T5 may be connected to, through the fourth connection line CL4, the second terminal of the second transistor T2 included in the first pixel circuit layer 110 at the fourth node n4 and may be connected to a pixel driving electrode AE of the light emitting device ED included in the light emitting device layer 170.

The sixth transistor T6 may be turned on or off based on the n−1$^{th}$ scan control signal supplied through the n−1$^{th}$ scan control line SCL(n−1). When the sixth transistor T6 is turned on, the third node n3 may be initialized by the initialization voltage supplied through the initialization voltage line IVL and the sixth transistor T6.

The sixth transistor T6 according to an embodiment may include the first terminal connected to the initialization voltage line IVL and the first terminal of the fifth transistor T5, the second terminal connected to the second terminal of the capacitor C, the first terminal of the fourth transistor T4, and the gate of the driving transistor Tdr, and the gate connected to the n−1$^{th}$ scan control line SCL(n−1). The first terminal of the sixth transistor T6 may be connected to the initialization voltage line IVL and the first terminal of the fifth transistor T5. The second terminal of the sixth transistor T6 may be connected to the second terminal of the capacitor C, the first terminal of the fourth transistor T4, and the gate of the driving transistor Tdr. Particularly, the second terminal of the sixth transistor T6 may be connected to, through the third connection line CL3, the gate of the driving transistor Tdr included in the first pixel circuit layer 110 at the third node n3 and may be connected to the second terminal of the capacitor C included in the first pixel circuit layer 110.

The light emitting device layer 170 may include a light emitting device ED, which is electrically connected to the first pixel circuit PC1 and the second pixel circuit PC2 and emits a current on the basis of a current supplied from the first pixel circuit PC1, and a bank pattern BNK.

The light emitting device ED according to an embodiment may include a pixel driving electrode AE (referred to as an anode electrode) connected to the pixel driving circuit PDC, a light emitting layer EL formed on the pixel driving electrode AE, and a common electrode layer CE (referred to as a cathode electrode) electrically connected to the light emitting layer EL.

The pixel driving electrode AE may be disposed in an opening area of the pixel P and may be electrically connected to, through the second transistor T2, the second terminal of the driving transistor Tdr included in the first pixel circuit PC1.

The pixel driving electrode AE according to an embodiment may include a metal material which is high in reflectance. For example, the pixel driving electrode AE may be formed in a multi-layer structure such as a stacked structure (titanium/aluminum/titanium (Ti/Al/Ti)) of aluminum (Al) and titanium (Ti), a stacked structure (indium tin oxide/aluminum/indium tin oxide (ITO/Al/ITO)) of Al and indium tin oxide (ITO), an APC (silver/palladium/copper (Ag/Pd/Cu)) alloy, or a stacked structure (ITO/APC/ITO) of an APC alloy and ITO, or may include a single-layer structure including one material or an alloy material of two or more materials selected from among Ag, Al, molybdenum (Mo), gold (Au), magnesium (Mg), calcium (Ca), and barium (Ba).

However, the light emitting device ED may be formed to be transparent. In this case, the pixel driving electrode AE may include transparent metal such as ITO or indium zinc oxide (IZO).

An edge of the pixel driving electrode AE may be covered by the bank pattern BNK. The bank pattern BNK may be disposed in a pixel area other than an opening area of the pixel P and may cover an edge of the pixel driving electrode AE. Accordingly, the opening area of the pixel P may be defined.

The bank pattern BNK according to an embodiment may define the opening area of the pixel P as a pentile structure or a stripe structure.

The light emitting layer EL according to an embodiment may be formed in the whole display area AA of the substrate 10 to cover the pixel driving electrode AE and the bank pattern BNK.

The light emitting layer EL according to an embodiment may include two or more light emitting parts for emitting white light. For example, the light emitting layer EL according to an embodiment may include a first light emitting part and a second light emitting part, for emitting white light on the basis of a combination of first light and second light. Here, the first light emitting part may emit the first light and may include one of a blue light emitting part, a green light emitting part, a red light emitting part, a yellow light emitting part, and a yellowish green light emitting part. The second light emitting part may include a light emitting part emitting the second light having a complementary color relationship with the first light among a blue light emitting part, a green light emitting part, a red light emitting part, a yellow light emitting part, and a yellowish green light emitting part.

According to another embodiment, the light emitting layer EL may include one of a blue light emitting part, a green light emitting part, and a red light emitting part, for emitting colored light corresponding to a color set in the pixel P. For example, the light emitting layer EL according to another embodiment may include one of an organic light emitting layer, an inorganic light emitting layer, and a quantum dot light emitting layer, or may include a stacked or combination structure of an organic light emitting layer (or an inorganic light emitting layer) and a quantum dot light emitting layer.

Additionally, the light emitting device ED according to an embodiment may further include a function layer for enhancing the emission efficiency and/or lifetime of the light emitting layer EL.

The common electrode layer CE may be formed to be electrically connected to the light emitting layer EL. The common electrode layer CE may be formed in the whole display area AA of the substrate 10 and may be connected to the light emitting layer EL provided in each pixel area PA in common.

The common electrode layer CE according to an embodiment may include a transparent conductive material, transparent metal, or a semi-transmissive conductive material, which may transmit light. When the common electrode layer CE includes the semi-transmissive conductive material, the emission efficiency of light emitted from the light emitting device ED may increase based on a micro-cavity. The semi-transmissive conductive material according to an embodiment may include Mg, Ag, or an alloy of Mg and Ag. Additionally, a capping layer for adjusting a refractive index of the light emitted from the light emitting device ED to enhance the emission efficiency of the light may be further formed on the common electrode layer CE.

According to another embodiment, the light emitting layer EL may include a micro light emitting diode device implemented as an integrated circuit (IC) type. The micro light emitting diode device may include a first terminal electrically connected to the pixel driving electrode AE and a second terminal electrically connected to the common electrode layer CE.

The pixel P according to an embodiment may further include a planarization layer 160 covering the second pixel circuit layer 120 and an encapsulation layer 190 covering the light emitting device layer 170.

The planarization layer 160 may be disposed on the substrate 10 to cover the second pixel circuit layer 120 and may provide a flat surface on the second pixel circuit layer 120.

The light emitting device layer 170 may be disposed on the planarization layer 160. In this case, the pixel driving electrode AE of the light emitting device layer 170 may be connected to the second terminal of the second transistor T2 of the first pixel circuit PC1 through an electrode contact hole provided in the planarization layer 160, and the first terminal of the second transistor T2 may be electrically connected to the second terminal of the driving transistor Tdr.

The encapsulation layer 190 may be formed on the substrate 10 to surround the light emitting device layer 170. The encapsulation layer 190 may prevent oxygen or water from penetrating into the light emitting device ED.

The encapsulation layer 190 according to an embodiment may include at least one inorganic layer for preventing or minimizing the penetration of oxygen or water and an organic layer which covers particles occurring in a manufacturing process. For example, the encapsulation layer 190 may include a first inorganic layer, an organic layer on the first inorganic layer, and a second inorganic layer on the organic layer.

Additionally, the pixel P according to an embodiment of the present disclosure may further include a black matrix overlapping the bank pattern BNK and a wavelength conversion layer disposed in the opening area.

The black matrix may be disposed on the encapsulation layer 190 to overlap the bank pattern BNK.

The wavelength conversion layer according to an embodiment may include a color filter which is disposed on the encapsulation layer 190 overlapping the opening area of the pixel P to transmit only a color wavelength, set in the pixel P, of white light incident from the light emitting device ED. For example, the wavelength conversion layer may transmit only a wavelength of red, green, or blue. When the light emitting layer EL of the light emitting device ED includes a light emitting layer emitting red light, green light, and blue light, the wavelength conversion layer may be omitted.

The pixel P according to an embodiment of the present disclosure may further include a barrier film and a light path control layer.

The barrier film may be attached on the encapsulation layer 190 by using an adhesive layer. The barrier film may primarily prevent the penetration of oxygen or water and may include a material which is low in water vapor transmission rate.

The light path control layer may control a path of incident light.

The light path control layer according to an embodiment may include a plurality of refractive layers. The plurality of refractive layers may have different refractive indexes. The light path control layer may have a structure where a high refractive layer and a low refractive layer are alternately stacked. The light path control layer according to an embodiment may change a path of incident light to minimize a color shift phenomenon caused by a viewing angle.

According to another embodiment, the light path control layer may be a polarization layer. The polarization layer may change external light, reflected by TFTs and/or lines provided in the pixel P, to circularly-polarized light, thereby enhancing visibility and a contrast ratio.

An operation of a pixel according to an embodiment of the present disclosure will be described below.

The pixel P according to an embodiment of the present disclosure may operate in an initialization period, a routing period, and an emission period. For example, one frame of a light emitting display apparatus to which a light emitting display panel according to an embodiment of the present disclosure is applied may include an initialization period for initializing the gate of the driving transistor Tdr, a routing period for storing a sampling voltage and a data voltage each corresponding to a characteristic value (for example, a threshold voltage) of the driving transistor Tdr, and an emission period for allowing the light emitting device ED to emit light with a current corresponding to the data voltage.

In the initialization period, a low voltage may be supplied to the n−1$^{th}$ scan control line SCL(n−1), and thus, the sixth transistor T6 may be turned on. In this case, a voltage of the third node n3 may be an initialization voltage Vinit. The third node n3 may be a portion connected to the second terminal of the capacitor C, the gate of the driving transistor Tdr, the first terminal of the fourth transistor T4, and the second terminal of the sixth transistor T6.

In the routing period, a low voltage may be supplied to the n$^{th}$ scan control line SCL(n), and thus, the third transistor T3 may be turned on. In this case, the voltage of the third node n3 may be a sum voltage of a data voltage Vdata supplied through the data line DL and a threshold voltage Vth of the driving transistor Tdr. That is, the voltage of the third node n3 may be changed from the initialization voltage Vinit to the sum voltage (=Vdata+Vth) of the data voltage Vdata and the threshold voltage Vth.

In the emission period, a low voltage may be supplied to the emission control line ECL, and thus, the first transistor T1 and the second transistor T2 may be turned on. In this case, a current supplied to the light emitting device ED may be proportional to the square of a difference voltage between a gate-source voltage Vgs of the driving transistor Tdr and the threshold voltage Vth. In the emission period, a gate voltage (i.e., the voltage of the third node n3) of the driving transistor Tdr may be the sum voltage (=Vdata+Vth) of the data voltage Vdata and the threshold voltage Vth, and a source voltage of the driving transistor Tdr may be a pixel driving voltage Vdd supplied through the pixel driving voltage line PL. Therefore, the difference voltage between the gate-source voltage Vgs of the driving transistor Tdr and the threshold voltage Vth may be [((Vdata+Vth)−Vdd)−Vth=Vdata−Vdd]. Therefore, a current supplied to the light emitting device ED may be proportional to the square of a difference voltage (=Vdata−Vdd) between the data voltage Vdata and the pixel driving voltage Vdd.

That is, according to the present disclosure, a current supplied to the light emitting device ED may be irrelevant to the threshold voltage Vth of the driving transistor Tdr and may be determined by only the pixel driving voltage Vdd and the data voltage Vdata.

Therefore, according to the present disclosure, even when the driving transistor Tdr is degraded to cause a variation of the threshold voltage Vth of the driving transistor Tdr, a current supplied to the light emitting device ED may not be affected by the variation of the threshold voltage Vth. Accordingly, according to the present disclosure, the current may be controlled by only the data voltage Vdata regardless of the amount of variation of the threshold voltage Vth of the driving transistor Tdr.

Figure 7:
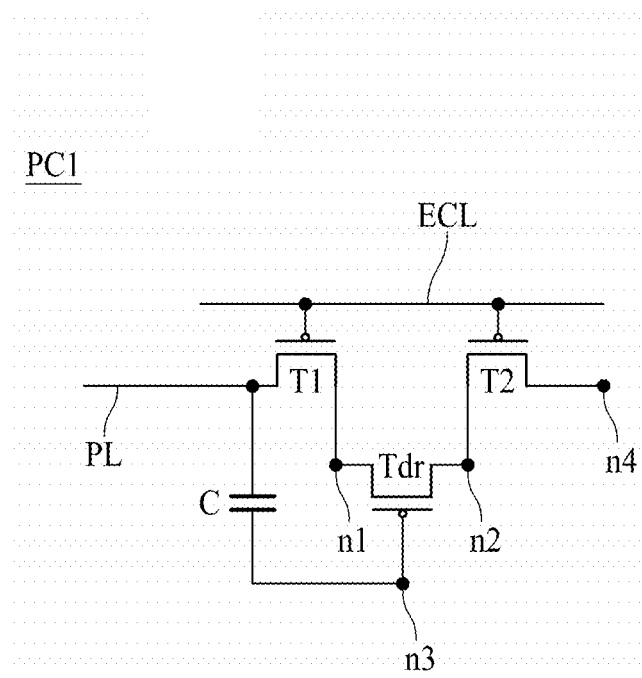
FIG. 7 is an exemplary diagram illustrating a first pixel circuit illustrated in FIG. 4.
Figure 8:
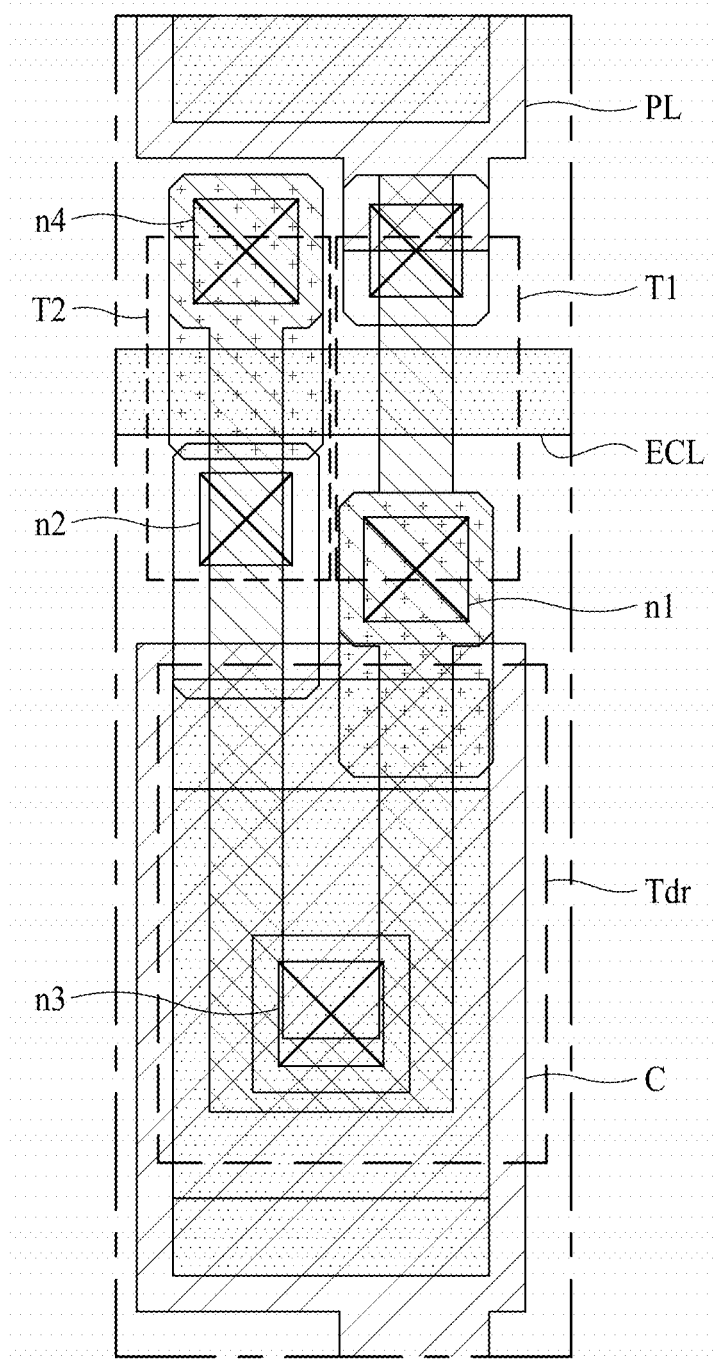
FIG. 8 is an exemplary diagram illustrating a layout of a first pixel circuit layer including the first pixel circuit illustrated in FIG. 7.
Figure 9:
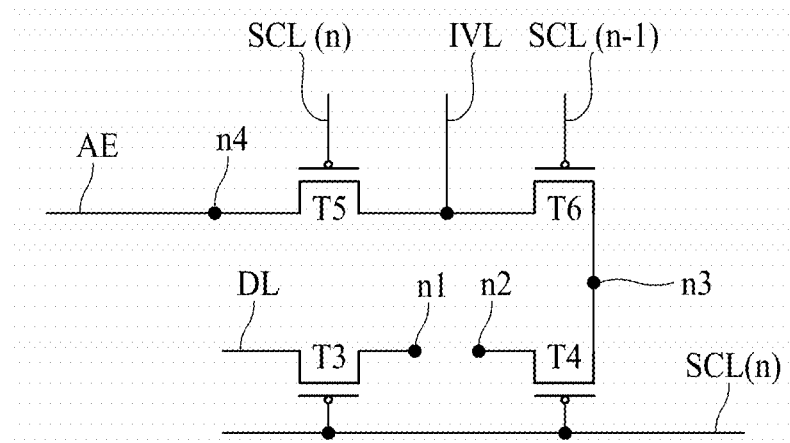
FIG. 9 is an exemplary diagram illustrating a second pixel circuit illustrated in FIG. 4.

FIG. 7 is an exemplary diagram illustrating a first pixel circuit illustrated in FIG. 4, and FIG. 8 is an exemplary diagram illustrating a layout of a first pixel circuit layer including the first pixel circuit illustrated in FIG. 7. That is, FIG. 7 illustrates the first pixel circuit PC1 included in one pixel, and FIG. 9 illustrates a plane structure of the first pixel circuit layer 110 in one pixel.

As described above, the first pixel circuit layer 110 may include the driving transistor Tdr, the first transistor T1, the second transistor T2, and the capacitor C.

A first node n1 provided between the first transistor T1 and the driving transistor Tdr may be connected to, through a first connection line CL1, the second terminal of the third transistor T3 included in the second pixel circuit layer 120. To this end, as illustrated in FIG. 8, the first node n1 connected to the first connection line CL1 may be provided between the first transistor T1 and the driving transistor Tdr, and a first contact hole may be formed in the first node n1. First to fourth nodes n1 to n4 to be described below may be connected to the first to fourth nodes n1 to n4, included in the second pixel circuit layer 120 illustrated in FIG. 10, through first to fourth connection lines CL1 to CL4. However, a connection line connecting two corresponding nodes may directly connect the two corresponding nodes, or may connect the two corresponding nodes by using separate nodes and separate contact holes. Therefore, positions of the first to fourth nodes n1 to n4 illustrated in FIG. 8 may differ from positions of the first to fourth nodes n1 to n4 illustrated in FIG. 10. Also, first to fourth contact holes described with reference to FIG. 8 may be the same as first to fourth contact holes described with reference to FIG. 10, or may be separate contact holes which are electrically connected to one another.

A second node n2 provided between the second transistor T2 and the driving transistor Tdr may be connected to, through a second connection line CL2, the second terminal of the fourth transistor T4 included in the second pixel circuit layer 120. To this end, as illustrated in FIG. 8, the second node n2 connected to the second connection line CL2 may be provided between the second transistor T2 and the driving transistor Tdr, and a second contact hole may be formed in the second node n2.

The capacitor C may be formed to overlap the driving transistor Tdr. A third node n3 provided between the capacitor C and the gate of the driving transistor Tdr may be connected to, through a third connection line CL3, the second terminal of the sixth transistor T6 included in the second pixel circuit layer 120 and the first terminal of the fourth transistor T4 included in the second pixel circuit layer 120. To this end, as illustrated in FIG. 8, the third node n3 connected to the third connection line CL3 may be provided between the capacitor C and the driving transistor Tdr, and a third contact hole may be formed in the third node n3.

A fourth node n4 provided between the second transistor T2 and the light emitting device ED may be connected to, through a fourth connection line CL4, the second terminal of the fifth transistor T5 included in the second pixel circuit layer 120. To this end, as illustrated in FIG. 8, the fourth node n4 connected to the fourth connection line CL4 may be provided at one end of the second transistor T2, and a fourth contact hole may be formed in the fourth node n4.

Figure 10:
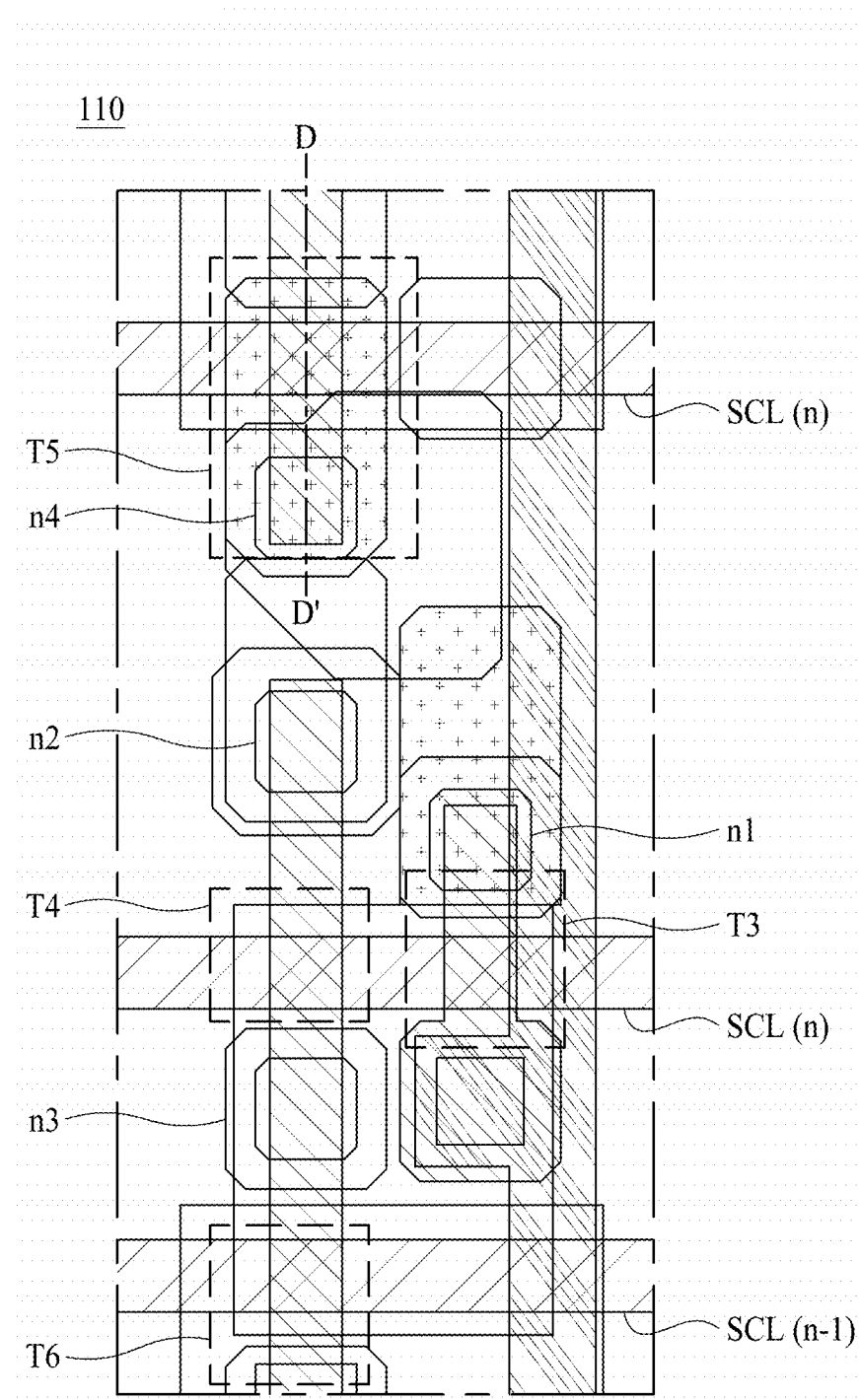
FIG. 10 is an exemplary diagram illustrating a layout of a second pixel circuit layer including the second pixel circuit illustrated in FIG. 9.

FIG. 9 is an exemplary diagram illustrating a second pixel circuit illustrated in FIG. 4, and FIG. 10 is an exemplary diagram illustrating a layout of a second pixel circuit layer including the second pixel circuit illustrated in FIG. 9.

As described above, the second pixel circuit layer 120 may include the third to sixth transistors T3 to T6.

The third transistor T3 may be connected to the first transistor T1 and the driving transistor Tdr, included in the first pixel circuit layer 110, through the first connection line CL1 included in the first node n1. To this end, as illustrated in FIG. 9, the first node n1 connected to the first connection line CL1 may be provided at the second terminal of the third transistor T3, and a first contact hole may be formed in the first node n1.

The fourth transistor T4 may be connected to the second transistor T2 and the driving transistor Tdr, included in the first pixel circuit layer 110, through the second connection line CL2 included in the second node n2. To this end, as illustrated in FIG. 9, the second node n2 connected to the second connection line CL2 may be provided at the second terminal of the fourth transistor T4, and a second contact hole may be formed in the second node n2.

The fourth transistor T4 may be connected to the capacitor C and the driving transistor Tdr, included in the first pixel circuit layer 110, through the third connection line CL3 included in the third node n3. To this end, as illustrated in FIG. 9, the third node n3 connected to the third connection line CL3 may be provided at the first terminal of the fourth transistor T4, and a third contact hole may be formed in the third node n3.

The fifth transistor T5 may be connected to the second transistor T2, included in the first pixel circuit layer 110, through the fourth connection line CL4 included in the fourth node n4. To this end, as illustrated in FIG. 9, the fourth node n4 connected to the fourth connection line CL4 may be provided at the second terminal of the fifth transistor T5, and a fourth contact hole may be formed in the fourth node n4. The fourth connection line CL4 may extend up to the pixel driving electrode AE of the light emitting device ED included in the light emitting device layer 170.

Figure 11:
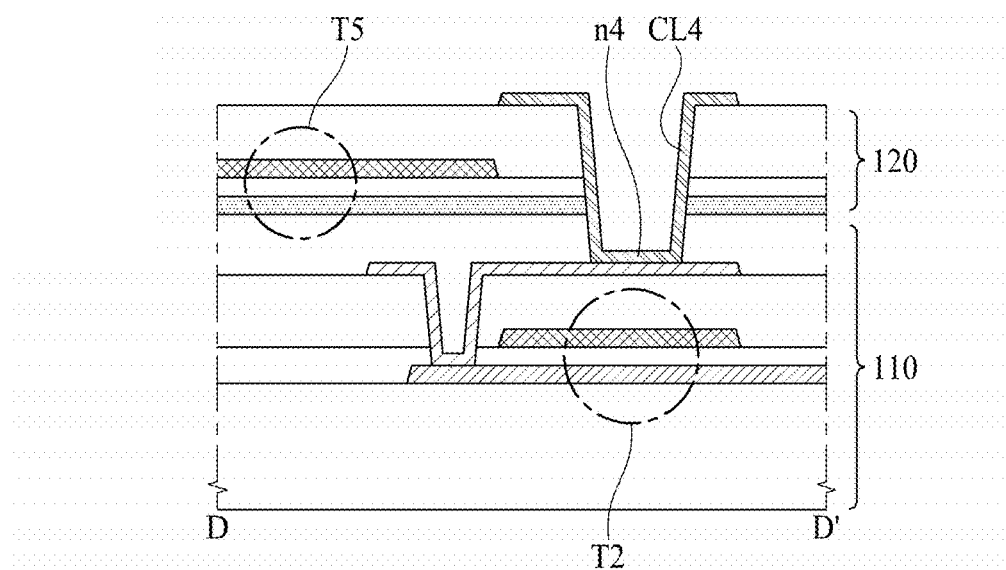
FIG. 11 is an exemplary diagram illustrating a cross-sectional surface taken along line D-D' illustrated in FIG. 10.

FIG. 11 is an exemplary diagram illustrating a cross-sectional surface taken along line D-D' illustrated in FIG. 10.

As described above, the first pixel circuit PC1 included in the first pixel circuit layer 110 may be electrically connected to the second pixel circuit PC2 included in the second pixel circuit layer 120 through the first to fourth connection lines CL1 to CL4.

The fourth connection line CL4 among the first to fourth connection lines CL1 to CL4, as illustrated in FIG. 11, may extend from the fourth node n4 of the first pixel circuit layer 110 to the second pixel circuit layer 120. In the cross-sectional view of FIG. 11, a structure where the second transistor T2 is connected to the fifth transistor T5 is not clearly illustrated, but the second transistor T2 may be connected to the fifth transistor T5 through the fourth connection line CL4.

The first to third connection lines CL1 to CL3 may be provided in the light emitting display panel 100 as a type similar to the fourth connection line CL4 illustrated in FIG. 11.

Figure 12:
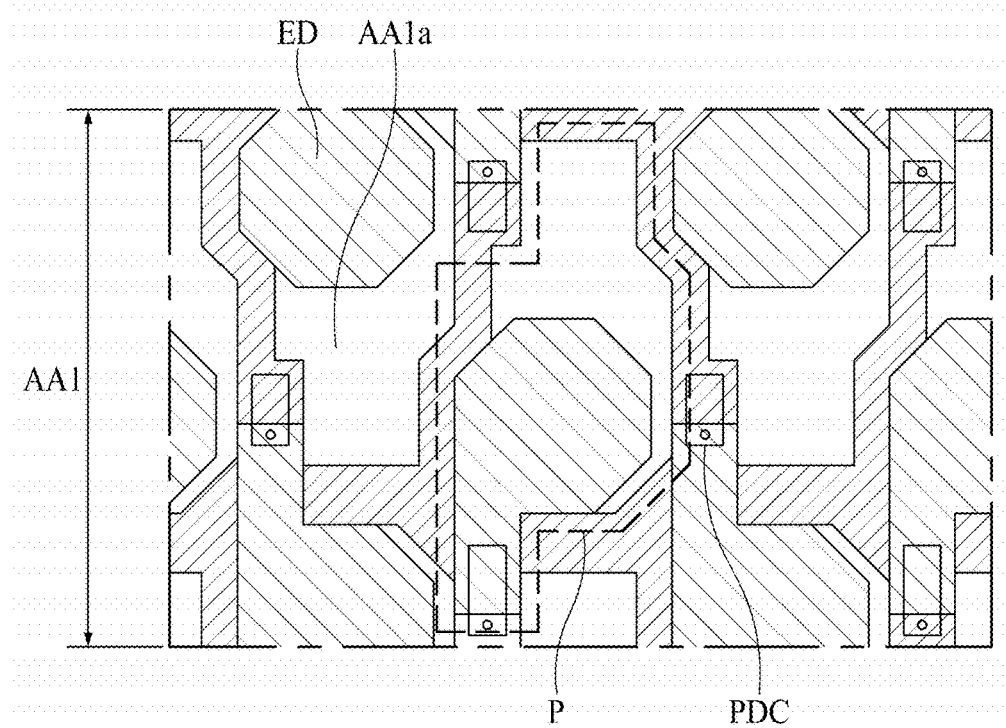
FIG. 12 is an exemplary diagram illustrating a plane of each pixel of a light emitting display panel according to the present disclosure.

FIG. 12 is an exemplary diagram illustrating a plane of each pixel of a light emitting display panel according to the present disclosure, and particularly, is an exemplary diagram illustrating a portion of a transparent area AA1.

As described above, the transparent area AA1 may include a first pixel circuit layer 110 including a first pixel circuit PC1, a second pixel circuit layer 120 which is provided on the first pixel circuit layer 110 and includes a second pixel circuit PC2, and a light emitting device layer 170 which includes at least one light emitting device ED provided on the second pixel circuit layer 120. The first pixel circuit PC1 and the second pixel circuit PC2 may be included in a pixel driving circuit PDC configuring one pixel.

That is, in the present disclosure, the pixel driving circuit PDC included in one pixel may be divided into the first pixel circuit PC1 and the second pixel circuit PC2, the first pixel circuit PC1 may be included in the first pixel circuit layer 110, and the second pixel circuit PC2 may be included in the second pixel circuit layer 120. Accordingly, a width of an area where the pixel driving circuit PDC is provided may be reduced compared to a width of an area where a pixel driving circuit applied to a light emitting display panel of the related art is provided.

Therefore, in one pixel P, an area of the pixel driving circuit PDC may be reduced, and thus, as illustrated in FIG. 12, the pixel driving circuit PDC may be provided in an area which does not overlap the light emitting device ED, and particularly, may be provided outside a light transmitting area AA1a, transmitting light, of the pixel P. Therefore, a width of the light transmitting area AA1a may increase, and thus, a light transmittance of the transparent area AA1 may increase.

Moreover, since the pixel driving circuit PDC does not overlap the light emitting device ED, the light emitting device ED may also be formed to be transparent, and thus, a light transmittance of the transparent area AA1 may be more enhanced.

Particularly, in the present disclosure, in order to simplify the form of the light transmitting area AA1a and maximally increase an area of the light transmitting area AA1a, the first pixel circuit PC1 and the second pixel circuit PC2 may be provided in an area which does not overlap the light emitting device ED. For example, as illustrated in FIG. 12, a plurality of pixel driving circuits PDC each including the first pixel circuit and the second pixel circuit may be provided in an area which does not overlap a plurality of light emitting devices ED.

Moreover, a plurality of first light emitting devices and a plurality of second light emitting devices provided in the transparent area AA1 may be provided in one row in a first direction, and the second light emitting devices may be disposed to be staggered with respect to the first light emitting devices in a second direction. For example, when a widthwise direction of FIG. 12 is the first direction and a lengthwise direction of FIG. 12 is the second direction, the first light emitting devices may be provided in one row in the first direction, and the second light emitting devices may be provided in one row in the first direction.

In this case, the plurality of first light emitting devices and the plurality of second light emitting devices may not be provided in one row in the second direction and may be disposed to be staggered in the second direction.

Particularly, the plurality of first light emitting devices and the plurality of second light emitting devices may be disposed to face one another.

Moreover, like that the plurality of first light emitting devices and the plurality of second light emitting devices are disposed to be staggered, a plurality of first pixel circuit layers and a plurality of second pixel circuit layers connected to the first light emitting devices may be disposed to be staggered with respect to a plurality of first pixel circuit layers and a plurality of second pixel circuit layers connected to the second light emitting devices.

To provide an additional description, in the present disclosure, a plurality of transistors configuring the pixel driving circuit PDC may be distributed and disposed in the first pixel circuit layer 110 and the second pixel circuit layer 120, and the pixel driving circuit PDC may be formed to have, for example, a size of less than 25×10 μm. Therefore, as illustrated in FIG. 12, the pixel driving circuit PDC may be disposed under a black matrix, and thus, the light transmitting area AA1a may increase.

Particularly, according to the present disclosure, an anode of the light emitting device (i.e., the pixel driving electrode AE) may include transparent metal, a line in the light transmitting area AA1a may be removed, and the division of the light transmitting area AA1a transmitting light may be minimized. That is, a size of the light transmitting area AA1a may increase, and the form of the light transmitting area AA1a may be simplified, thereby enhancing a light transmittance of the transparent area AA1.

That is, according to the present disclosure, a transparency of the light emitting display panel 100 may be maximized, and when a camera is disposed at a lower portion of the light emitting display panel, a reduction in amount of light may decrease, and the form of the light transmitting area AA1a may be simplified, thereby preventing an image captured by the camera from being distorted by a diffraction of light.

Figure 13:
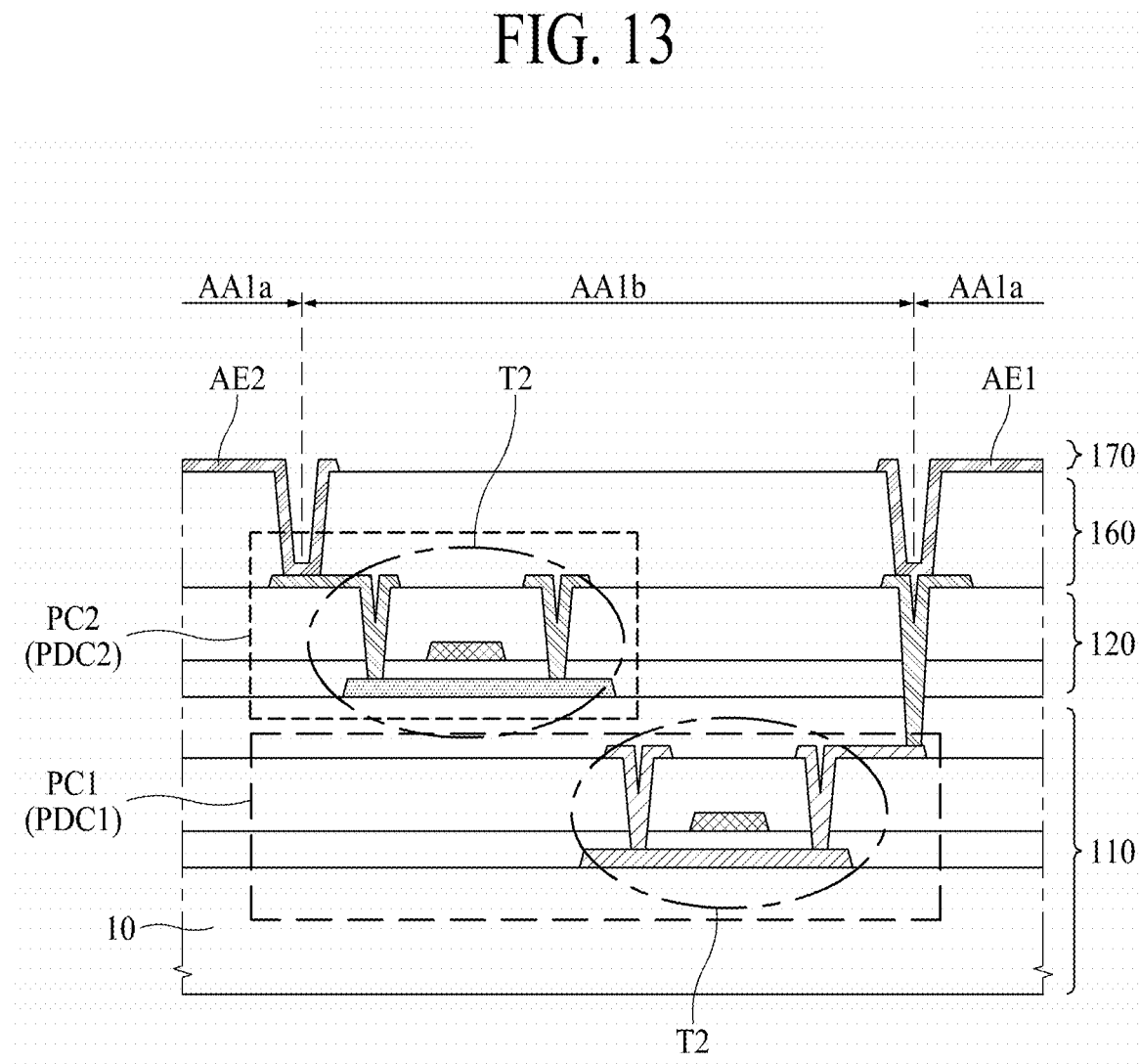
FIG. 13 is an exemplary diagram illustrating a cross-sectional surface of an area including a plurality of pixel driving circuits in a light emitting display panel according to the present disclosure.
Figure 14:
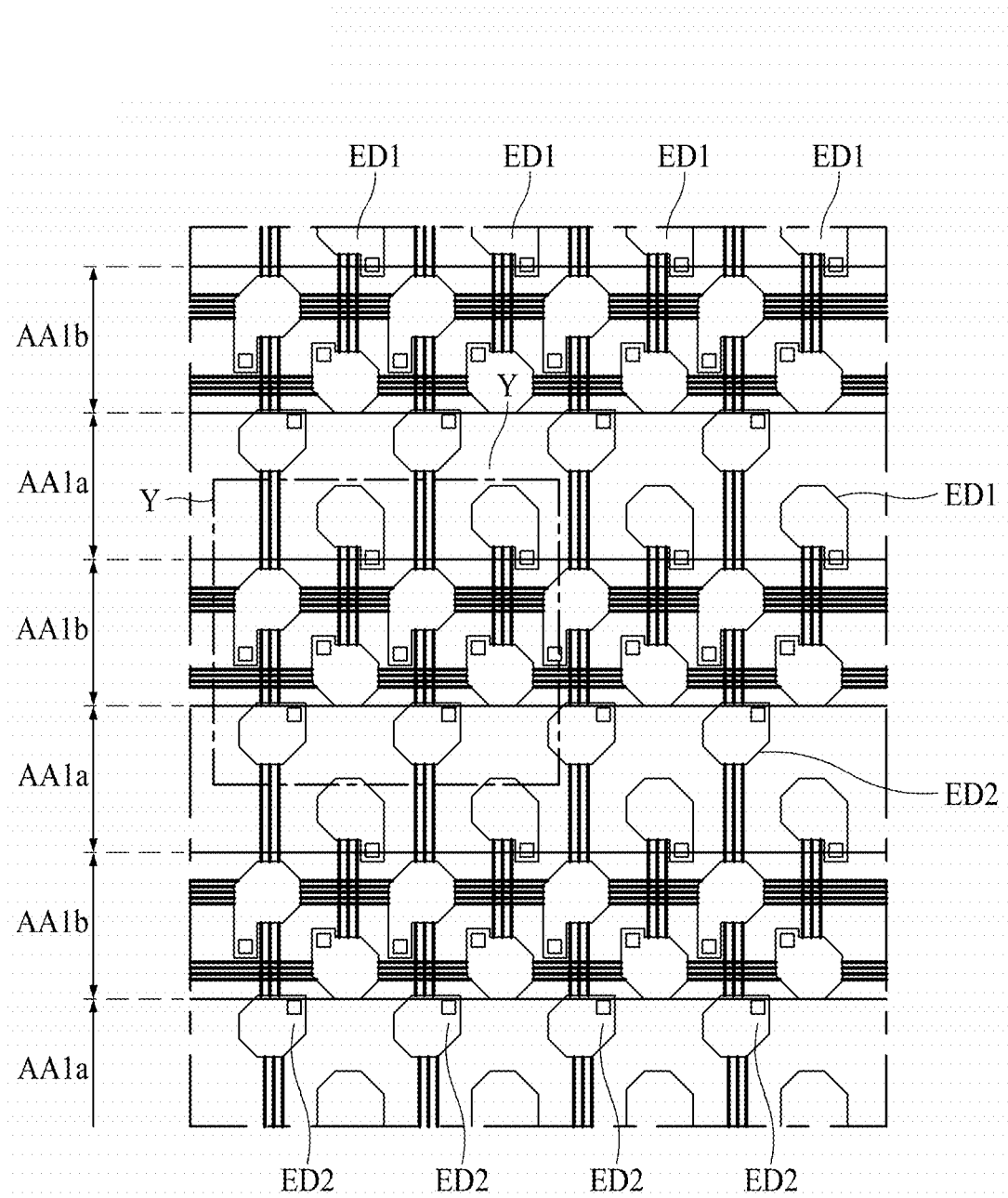
FIG. 14 is an exemplary diagram illustrating a non-transmissive area and a light transmitting area which are repeatedly formed in a transparent area of a light emitting display panel according to the present disclosure.
Figure 15:
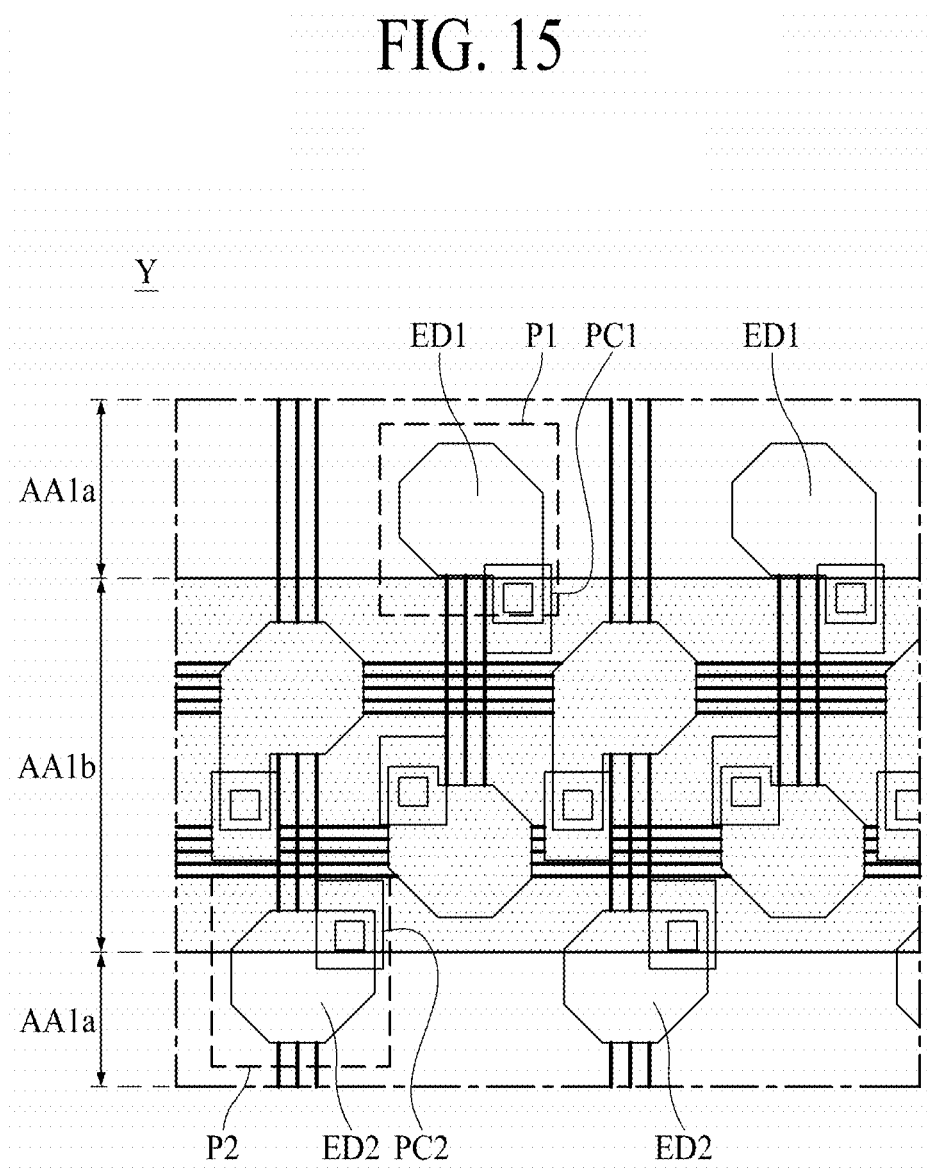
FIG. 15 is an exemplary diagram illustrating the enlargement of a region Y illustrated in FIG. 14.

FIG. 13 is an exemplary diagram illustrating a cross-sectional surface of an area including a plurality of pixel driving circuits in a light emitting display panel according to the present disclosure, FIG. 14 is an exemplary diagram illustrating a non-transmissive area and a light transmitting area which are repeatedly formed in a transparent area of a light emitting display panel according to the present disclosure, and FIG. 15 is an exemplary diagram illustrating the enlargement of a region Y illustrated in FIG. 14. In the following description, descriptions which are the same as or similar to descriptions given above with reference to FIGS. 1 to 12 are omitted or will be briefly given.

As described above, the light emitting display panel according to the present disclosure may include a display area AA displaying an image and a non-display area IA provided outside the display area AA. The display area AA may include a transparent area AA1 corresponding to an area where a camera 600 is disposed and an opaque area AA2 provided outside the transparent area AA1.

In this case, the transparent area AA1 may include a first pixel circuit layer 110 including a first pixel circuit PC1, a second pixel circuit layer 120 which is provided on the first pixel circuit layer 110 and includes a second pixel circuit PC2, and a light emitting device layer 170 which includes at least one light emitting device ED provided on the second pixel circuit layer 120. A driving transistor Tdr for controlling the amount of current flowing to the at least one light emitting device ED may be included in at least one of the first pixel circuit layer 110 and the second pixel circuit layer 120.

That is, as illustrated in FIG. 5, a pixel P applied to the light emitting display panel according to the present disclosure may include a pixel driving circuit layer 130 including the pixel driving circuit PDC and a light emitting device layer 170 including a light emitting device ED electrically connected to the pixel driving circuit PDC.

The pixel driving circuit layer 130 may include a first pixel circuit layer 110 including a first pixel circuit PC1 and a second pixel circuit layer 120 including a second pixel circuit PC2.

In the present disclosure described above with reference to FIGS. 1 to 12, the first pixel circuit and the second pixel circuit may be included in a pixel driving circuit configuring one of a plurality of pixels provided in the transparent area AA1, and a light emitting device connected to the second pixel circuit may be included in the light emitting device layer 170. That is, in the present disclosure described above with reference to FIGS. 1 to 12, the first pixel circuit and the second pixel circuit may be included in the pixel driving circuit PDC included in the one pixel P.

However, in the light emitting display panel according to the present disclosure illustrated in FIG. 13, the first pixel circuit PC1 may be a first pixel driving circuit PDC1 included in the first pixel P1, the second pixel circuit PC2 may be a second pixel driving circuit PDC2 included in the second pixel P2, and the light emitting device layer 170 may include a first light emitting device ED1 connected to the first pixel circuit PC1 and a second light emitting device ED2 connected to the second pixel circuit PC2.

That is, in in the light emitting display panel 100 according to the present disclosure illustrated in FIGS. 13 to 15, the first pixel circuit PC1 may be a pixel driving circuit PDC which is as illustrated in FIG. 3. In the following description, a pixel driving circuit included in a first pixel P1 may be referred to as a first pixel driving circuit PDC1, and the first pixel driving circuit PDC1 may be the same circuit as the first pixel circuit PC1.

Moreover, in the present disclosure, the second pixel circuit PC2 may be a pixel driving circuit PDC which is as illustrated in FIG. 3. In the following description, a pixel driving circuit included in a second pixel P2 may be referred to as a second pixel driving circuit PDC2, and the second pixel driving circuit PDC2 may be the same circuit as the second pixel circuit PC2.

To provide an additional description, in the present disclosure, the first pixel circuit PC1 and the second pixel circuit PC2 may be different pixel driving circuits included in the first and second pixels P1 and P2 which differ.

In this case, as illustrated in FIG. 13, the first pixel circuit PC1 may be included in the first pixel circuit layer 110, the second pixel circuit PC2 may be included in the second pixel circuit layer 120 provided on the first pixel circuit layer 110, and the first light emitting device ED1 and the second light emitting device ED2 may be included in the light emitting device layer 170 provided on the second pixel circuit layer 120.

To provide an additional description, as illustrated in FIG. 13, the second terminal of the second transistor T2 of the first pixel circuit PC1 included in the first pixel circuit layer 110 may pass through the second pixel circuit layer 120 and may be connected to the first light emitting device ED1 included in the light emitting device layer 170, and particularly, may be connected to a first pixel driving electrode AE1 configuring the first light emitting device ED1.

Moreover, the second terminal of the second transistor T2 of the second pixel circuit PC2 included in the second pixel circuit layer 120 may be connected to the second light emitting device ED2 included in the light emitting device layer 170, and particularly, may be connected to a second pixel driving electrode AE2 configuring the second light emitting device ED2.

The planarization layer 160, as described above with reference to FIG. 3, may be provided between the second pixel circuit layer 120 and the light emitting device layer 170. Also, an encapsulation layer 190 covering the light emitting device layer 170 may be further provided on the light emitting device layer 170.

In the present disclosure, as illustrated in FIG. 13, since the first pixel circuit PC1 and the second pixel circuit PC2 configuring different pixels overlap each other, a width of the light transmitting area AA1a for transmitting light may increase in the transparent area AA1.

For example, in the present disclosure, as illustrated in FIGS. 14 and 15, the transparent area AA1 may include a plurality of non-transmissive area AA1b which include a plurality of first pixel circuits PC1 and a plurality of second pixel circuits PC2 and a plurality of light transmitting areas AA1a which are provided between the plurality of non-transmissive area AA1b and include a plurality of first light emitting devices ED1 and a plurality of light emitting devices ED2, connected to the plurality of first pixel circuits PC1 or the plurality of second pixel circuits PC2 provided in the non-transmissive area AA1b, and a plurality of signal lines for transferring a driving signal to the plurality of first pixel circuits PC1 and the plurality of second pixel circuits PC2.

In the light transmitting area AA1a, the first light emitting devices ED1 provided in parallel along the light transmitting area AA1a may be connected to the first pixel circuits PC1 provided in the non-transmissive area AA1b, and the second light emitting devices ED2 provided in parallel along the light transmitting area AA1a may be connected to the second pixel circuits PC2 provided in the non-transmissive area AA1b.

To provide an additional description, in FIGS. 14 and 15, for example, the first pixel circuits PC1 provided in parallel along the non-transmissive area AA1b in the non-transmissive area AA1b may be connected to the first light emitting devices ED1 provided in parallel along the light transmitting area AA1a provided at one side of the non-transmissive area AA1b (for example, an upper end portion of the non-transmissive area AA1b).

Moreover, in FIGS. 14 and 15, for example, the second pixel circuits PC2 provided in parallel along the non-transmissive area AA1b in the non-transmissive area AA1b may be connected to the second light emitting devices ED2 provided in parallel along the light transmitting area AA1a provided at the other side of the non-transmissive area AA1b (for example, a lower end portion of the non-transmissive area AA1b).

In this case, the plurality of first light emitting devices ED1 and the plurality of second light emitting devices ED2 provided in the transparent area AA1 may be provided in one row in a first direction, and the second light emitting devices provided in one row in a first direction may be disposed to be staggered with respect to the first light emitting devices ED1 in a second direction differing from the first direction. For example, when a widthwise direction of FIG. 15 is the first direction and a lengthwise direction of FIG. 15 is the second direction, the first light emitting devices ED1 may be provided in one row in the first direction, and the second light emitting devices ED2 may be provided in one row in the first direction.

In this case, the plurality of first light emitting devices ED1 and the plurality of second light emitting devices ED2 may not be provided in one row in the second direction and may be disposed to be staggered in the second direction. That is, as illustrated in FIGS. 14 and 15, the plurality of first light emitting devices ED1 and the plurality of second light emitting devices ED2 may be disposed in the light transmitting area AA1a in opposite directions with the non-transmissive area AA1b therebetween, and the first pixel circuits PC1 and the second pixel circuits PC2 for driving the first light emitting devices ED1 and the second light emitting devices ED2 may be provided in the non-transmissive area AA1b.

Moreover, in addition to the first pixel circuits PC1 and the second pixel circuits PC2, other pixel circuits and other light emitting devices connected to the other pixel circuits may be further provided in the non-transmissive area AA1b. That is, a plurality of pixels may be provided in the non-transmissive area AA1b, and thus, other pixel circuits and other light emitting devices configuring the pixels may be provided in the non-transmissive area AA1b.

In the present disclosure, as described above, the first pixel circuits PC1, the second pixel circuits PC2, and other pixel circuits may be provided in the non-transmissive area AA1b, and the light emitting devices may be formed to be opaque. Therefore, in the non-transmissive area AA1b, a transmittance of light may be very low due to the light emitting devices, the first pixel circuits PC1, the second pixel circuits PC2, and the other pixel circuits.

However, only the first light emitting devices ED1, the second light emitting devices ED2, and the signal lines SL may be provided in the light transmitting area AA1a.

Therefore, a light transmittance of the light transmitting area AA1a may be higher than that of the non-transmissive area AA1b and may be higher than that of the light emitting display panel of the related art where a plurality of pixel circuits and a plurality of light emitting devices are provided as the same type.

The signal lines SL, as described above with reference to FIGS. 1 and 2, may denote lines provided in parallel in the second direction Y, and the signal lines SL may include the initialization voltage line IVL, the data line DL, the pixel driving voltage line PL, etc.

That is, in the transparent area AA1 applied to the present disclosure, as illustrated in FIGS. 13 to 15, the non-transmissive area AA1b including the first and second pixel circuits PC1 and PC2 and the light transmitting area AA1a including only the light emitting devices and the signal lines SL may be alternately provided. In this case, a light transmittance of the light transmitting area AA1a may be higher than that of the non-transmissive area AA1b and may be higher than that of the light emitting display panel of the related art where a plurality of pixel circuits and a plurality of light emitting devices are provided as the same type.

Therefore, according to the present disclosure, a light transmittance of the transparent area AA1 may be enhanced.

Features of the present disclosure described above will be briefly described below.

In the present disclosure, seven transistors and one capacitor configuring one pixel driving circuit PDC may be divisionally disposed at two layers (i.e., the first pixel circuit layer 110 and the second pixel circuit layer 120), or two different pixel driving circuits PDC1 and PDC2 may be divisionally disposed at the first pixel circuit layer 110 and the second pixel circuit layer 120.

In this case, since a planarization layer is provided on a top surface of the first pixel circuit layer 110, the second pixel circuit layer 120 may be divided by the planarization layer. The planarization layer may include an organic material or an inorganic material, or may be formed by a combination of an organic material and an inorganic material.

That is, in the present disclosure, since a plurality of transistors included in at least one pixel driving circuit are divisionally provided at two layers, an area where a plurality of pixel driving circuits are provided may be minimized, and thus, a transparent area including no circuit may be secured and a camera may be disposed in the transparent area.

Moreover, according to the present disclosure, the transparency or light transmittance of the light emitting display panel 100 may be maximized, and when a camera is disposed at a lower portion of the light emitting display panel, a reduction in amount of light may decrease, and the form of the light transmitting area AA1a may be simplified, thereby preventing an image captured by the camera from being distorted by a diffraction of light.

Moreover, according to the present disclosure, in a high-resolution light emitting display apparatus including a camera, an internal compensation circuit including seven transistors and one capacitor may be implemented.

In an embodiment of the present disclosure, it is described that all transistors included in the pixel driving circuit PDC are implemented as a P type, but the present disclosure is not limited thereto. Therefore, without departing from the technical feature of the present disclosure where an ultrahigh-resolution pixel is implemented by stacking two circuit layers, the transistors may all be modified into an N type, or some transistors may be modified into an N type.

A light emitting display apparatus, to which the present disclosure is applied, may be applied to portable electronic devices, requiring a high resolution, such as smartphones, mobile communication terminals, mobile phones, tablet personal computers (PCs), smart watches, watch phones, and wearable devices, appliances such as televisions, notebook computers, monitors, and refrigerators, and various products such as virtual image display apparatuses and head-mounted display apparatuses.

Particularly, according to the present disclosure, a light emitting display panel where a plurality of optical sensors including a camera are disposed at a rea surface thereof and a resolution of 200 ppi or more is realized may be implemented.

Moreover, in the above description, the display area of the light emitting display panel may include the transparent area AA1 and the opaque area AA2, but the display area may include only the transparent area AA1.

That is, in the above description, as an example of the present disclosure, a light emitting display panel has been described where a structure of the pixel driving circuit PDC in the opaque area AA2 is the same as or similar to a structure of the pixel driving circuit PDC in the opaque area AA2, which is used currently and generally.

However, in the light emitting display panel according to the present disclosure, the opaque area AA2 may be formed in the same structure as that of the transparent area AA1.

That is, in the present disclosure, the display area of the light emitting display panel may be configured with only the transparent area AA1 described above.

In the light emitting display panel according to the present disclosure, a plurality of transistors configuring each of a plurality of pixel driving circuits may be divisionally disposed at two layers. Therefore, even in a case where a size of each pixel is reduced by realizing a high resolution, a pixel driving circuit including a compensation circuit may be sufficiently disposed in each pixel, thereby implementing a high-resolution light emitting display panel.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the light emitting display panel of the present disclosure without departing from the spirit or scope of the disclosure. Thus, it is intended that the present disclosure cover the modifications and variations of this disclosure provided they come within the scope of the appended claims and their equivalents.

What is claimed is:

1. A light emitting display panel, comprising:
a transparent area corresponding to an area where a camera is provided,
wherein:
the transparent area comprises:
a first pixel circuit layer including a first pixel circuit;
a second pixel circuit layer provided on the first pixel circuit layer, the second pixel circuit layer including a second pixel circuit; and
a light emitting device layer provided on the second pixel circuit layer, the light emitting device layer including at least one light emitting device,
a driving transistor for controlling the amount of current flowing to the light emitting device is included in at least one of the first pixel circuit layer and the second pixel circuit layer,
the transparent area comprises:
a plurality of non-transmissive areas where a plurality of first pixel circuits and a plurality of second pixel circuits are provided; and
a plurality of light transmitting areas where the plurality of first pixel circuits and the plurality of second pixel circuits are not provided and light is transmitted,
the first pixel circuit and the second pixel circuit are included in a first pixel driving circuit configuring a first pixel,
the light emitting device layer comprises a first light emitting device connected to the second pixel circuit, and
the first pixel circuit comprises:
a first transistor including a first terminal connected to a pixel driving voltage line, a gate connected to an emission control line, and a second terminal connected to the second pixel circuit through a first connection line;
a driving transistor including a first terminal connected to the second terminal of the first transistor, a second terminal connected to the second pixel circuit through a second connection line, and a gate connected to the second pixel circuit through a third connection line;
a second transistor including a gate connected to the emission control line, a first terminal connected to the second terminal of the driving transistor, and a second terminal connected to the first light emitting device through a fourth connection line; and
a capacitor including a first terminal connected to the first terminal of the first transistor and a second terminal connected to the gate of the driving transistor.

2. The light emitting display panel of claim 1, wherein the second pixel circuit comprises:
a third transistor including a gate connected to an $n^{th}$ scan control line, a first terminal connected to a data line, and a second terminal connected to the first terminal of the driving transistor through the first connection line;
a fourth transistor including a gate connected to the $n^{th}$ scan control line, a first terminal connected to the gate of the driving transistor through the third connection line, and a second terminal connected to the second terminal of the driving transistor through the second connection line;
a fifth transistor including a gate connected to the $n^{th}$ scan control line, a first terminal connected to an initialization voltage line, and a second terminal connected to the second terminal of the second transistor through the fourth connection line; and
a sixth transistor including a gate connected to an $n-1^{th}$ scan control line, a first terminal connected to the initialization voltage line, and a second terminal connected to the first terminal of the fourth transistor.

3. The light emitting display panel of claim 1, wherein the first light emitting device comprises transparent metals.

4. The light emitting display panel of claim 1, wherein the first pixel circuit and the second pixel circuit are provided in an area which does not overlap the light emitting device.

5. The light emitting display panel of claim 4, wherein
a plurality of first light emitting devices and a plurality of second light emitting devices provided in the transparent area are each arranged in one row in a first direction, and
the plurality of second light emitting devices are disposed to be staggered with respect to the plurality of first light emitting devices in a second direction.

6. The light emitting display panel of claim 5, wherein the plurality of first light emitting devices and the plurality of second light emitting devices are disposed to face one another.

7. The light emitting display panel of claim 5, wherein a plurality of first pixel circuit layers and a plurality of second pixel circuit layers connected to the plurality of first light emitting devices are disposed to be staggered with respect to a plurality of first pixel circuit layers and a plurality of second pixel circuit layers connected to the plurality of second light emitting devices.

8. A light emitting display panel, comprising:
a transparent area corresponding to an area where a camera is provided,
wherein:
the transparent area comprises:
a first pixel circuit layer including a first pixel circuit;
a second pixel circuit layer provided on the first pixel circuit layer, the second pixel circuit layer including a second pixel circuit; and
a light emitting device layer provided on the second pixel circuit layer, the light emitting device layer including at least one light emitting device,
a driving transistor for controlling the amount of current flowing to the light emitting device is included in at least one of the first pixel circuit layer and the second pixel circuit layer, the first pixel circuit is a first pixel driving circuit included in a first pixel,
the second pixel circuit is a second pixel driving circuit included in a second pixel,
the light emitting device layer comprises a first light emitting device connected to the first pixel circuit and a second light emitting device connected to the second pixel circuit,
the transparent area further comprises:
a plurality of non-transmissive areas where light is not transmitted; and
a plurality of light transmitting areas where light is transmitted, and
each of the first pixel circuit and the second pixel circuit comprises:
a first transistor including a first terminal connected to a pixel driving voltage line and a gate connected to an emission control line;
a driving transistor including a first terminal connected to a second terminal of the first transistor a second transistor including a gate connected to the emission control line, a first terminal connected to a second terminal of the driving transistor, and
a second terminal connected to the light emitting device layer;
a capacitor including a first terminal connected to the first terminal of the first transistor and a second terminal connected to a gate of the driving transistor;
a third transistor including a gate connected to an nth scan control line, a first terminal connected to a data line, and a second terminal connected to the first terminal of the driving transistor;
a fourth transistor including a gate connected to the nth scan control line, a first terminal connected to the gate of the driving transistor, and a second terminal connected to the second terminal of the driving transistor;
a fifth transistor including a gate connected to the nth scan control line, a first terminal connected to an initialization voltage line, and a second terminal connected to the second terminal of the second transistor; and
a sixth transistor including a gate connected to an n−1th scan control line, a first terminal connected to the initialization voltage line, and a second terminal connected to the first terminal of the fourth transistor.

9. The light emitting display panel of claim 8, wherein
in the plurality of non-transmissive areas a plurality of first pixel circuits and a plurality of second pixel circuits are provided; and
in the plurality of light transmitting areas a plurality of first light emitting devices and a plurality of second light emitting devices connected to the plurality of first pixel circuits or the plurality of second pixel circuits provided in the plurality of non-transmissive areas are provided, the plurality of light transmitting areas being provided between the plurality of non-transmissive areas.

10. The light emitting display panel of claim 9, wherein
a plurality of first light emitting devices provided in parallel along a corresponding light transmitting area in each of the plurality of light transmitting areas are connected to a plurality of first pixel circuits provided in a corresponding non-transmissive area among the plurality of non-transmissive areas, and
a plurality of second light emitting devices provided in parallel along a corresponding light transmitting area in each of the plurality of light transmitting areas are connected to a plurality of second pixel circuits provided in a corresponding non-transmissive area among the plurality of non-transmissive areas.

11. The light emitting display panel of claim 9, wherein a plurality of first pixel circuits provided in parallel along a corresponding non-transmissive area among the plurality of non-transmissive areas are connected to a plurality of first light emitting devices provided in parallel along a corresponding light transmitting area provided at one side of the corresponding non-transmissive area, and a plurality of second pixel circuits provided in parallel along a corresponding non-transmissive area among the plurality of non-transmissive areas are connected to a plurality of second light emitting devices provided in parallel along a corresponding light transmitting area provided at the other side of the corresponding non-transmissive area.

12. The light emitting display panel of claim 8, wherein a plurality of first light emitting devices and a plurality of second light emitting devices provided in the transparent area are each arranged in one row in a first direction, and the plurality of second light emitting devices are disposed to be staggered with respect to the plurality of first light emitting devices in a second direction.

13. The light emitting display panel of claim 8, wherein in the plurality of non-transmissive areas, a plurality of first pixel circuits and a plurality of second pixel circuits are provided, and in the plurality of light transmitting areas, a plurality of first pixel circuits and a plurality of second pixel circuits are not provided, and a plurality of first light emitting devices and a plurality of second light emitting devices are disposed in the light transmitting area in opposite directions with the non-transmissive area therebetween.

* * * * *